United States Patent
Cadloni et al.

(10) Patent No.: US 10,770,168 B2
(45) Date of Patent: Sep. 8, 2020

(54) MEMORY SUB-SYSTEM WITH BACKGROUND SCAN AND HISTOGRAM STATISTICS

(71) Applicant: Micron Technology, Inc., Boise, ID (US)

(72) Inventors: Gerald L. Cadloni, Longmont, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 16/034,076

(22) Filed: Jul. 12, 2018

(65) Prior Publication Data

US 2020/0019458 A1   Jan. 16, 2020

(51) Int. Cl.
*G11C 29/52* (2006.01)
*G06F 11/10* (2006.01)

(52) U.S. Cl.
CPC .......... *G11C 29/52* (2013.01); *G06F 11/1068* (2013.01)

(58) Field of Classification Search
CPC ......... G11C 29/42; G11C 29/52; G11C 16/26; G11C 29/44; G06F 11/1004; G06F 11/1068; G06F 1/1072; G06F 11/108; G06F 11/1072
See application file for complete search history.

(56) References Cited

U.S. PATENT DOCUMENTS 10,061,640 B1 * 8/2018 Lu .................. G06F 11/1012
2015/0286528 A1 * 10/2015 Cai .................. G06F 11/1004
714/763

* cited by examiner

*Primary Examiner* — Shelly A Chase
(74) *Attorney, Agent, or Firm* — Perkins Coie LLP

(57) ABSTRACT

Several embodiments of systems incorporating memory sub-systems are disclosed herein. In one embodiment, a memory sub-system can include a memory component and a processing device configured to perform a background scan on a memory region of the memory component. In some embodiments, the background scan includes generating a bit error count (BEC) of a codeword saved on the memory region and saving statistical information corresponding to the BEC of the codeword to a histogram statistics log. In some embodiments, when the BEC of the codeword is greater than a BEC threshold, a refresh operation is scheduled for the memory region and/or logged. In these and other embodiments, when one or more error recovery error correction code (ECC) operations do not correct bit errors in the codeword, a refresh and/or retirement operation is schedule for the memory region and/or is logged.

17 Claims, 10 Drawing Sheets

| | 371 | 372 | 373 | 374 | 375 Sum 257049 | 376 Sum 257216 | 377 Sum 257124 | 378 Sum 257275 |
|---|---|---|---|---|---|---|---|---|
| | BEC Low | BEC High | BER Low | BER High | CE0 | CE1 | CE2 | CE3 |
| 381 | 0 | 0 | 0.000E+00 | 0.000E+00 | 123097 | 109276 | 101490 | 95117 |
| 382 | 1 | 2 | 1.085E-04 | 2.170E-04 | 132315 | 144875 | 151725 | 156562 |
| 383 | 3 | 4 | 3.255E-04 | 4.340E-04 | 1194 | 2012 | 2706 | 4062 |
| | 5 | 6 | 5.425E-04 | 6.510E-04 | 227 | 365 | 379 | 553 |
| | 7 | 8 | 7.595E-04 | 8.681E-04 | 98 | 200 | 250 | 244 |
| | 9 | 10 | 9.766E-04 | 1.085E-03 | 61 | 106 | 157 | 151 |
| | 11 | 12 | 1.194E-03 | 1.302E-03 | 27 | 90 | 118 | 140 |
| | 13 | 14 | 1.411E-03 | 1.519E-03 | 19 | 89 | 76 | 101 |
| | 15 | 16 | 1.628E-03 | 1.736E-03 | 4 | 51 | 53 | 67 |
| | 17 | 18 | 1.845E-03 | 1.953E-03 | 5 | 35 | 42 | 61 |
| | 19 | 20 | 2.062E-03 | 2.170E-03 | 0 | 27 | 34 | 42 |
| | 21 | 22 | 2.279E-03 | 2.387E-03 | 1 | 24 | 23 | 36 |
| | 23 | 24 | 2.496E-03 | 2.604E-03 | 0 | 22 | 17 | 28 |
| | 25 | 26 | 2.713E-03 | 2.821E-03 | 1 | 9 | 14 | 21 |
| | 27 | 28 | 2.930E-03 | 3.038E-03 | 0 | 8 | 11 | 21 |
| | 29 | 30 | 3.147E-03 | 3.255E-03 | 0 | 5 | 9 | 19 |
| | 31 | 32 | 3.364E-03 | 3.472E-03 | 0 | 8 | 4 | 11 |
| | 33 | 34 | 3.581E-03 | 3.689E-03 | 0 | 3 | 1 | 9 |
| | 35 | 36 | 3.798E-03 | 3.906E-03 | 0 | 2 | 3 | 5 |
| | 37 | 38 | 4.015E-03 | 4.123E-03 | 0 | 3 | 1 | 6 |
| | 39 | 40 | 4.232E-03 | 4.340E-03 | 0 | 3 | 2 | 2 |
| | 41 | 42 | 4.449E-03 | 4.557E-03 | 0 | 1 | 2 | 3 |
| | 43 | 44 | 4.666E-03 | 4.774E-03 | 0 | 1 | 4 | 7 |
| | 45 | 46 | 4.883E-03 | 4.991E-03 | 0 | 0 | 3 | 3 |
| | 47 | 48 | 5.100E-03 | 5.208E-03 | 0 | 1 | 0 | 2 |
| | 49 | 50 | 5.317E-03 | 5.425E-03 | 0 | 0 | 0 | 2 |
| | 51 | 52 | 5.534E-03 | 5.642E-03 | 0 | 0 | 0 | 0 |
| | 53 | 54 | 5.751E-03 | 5.859E-03 | 0 | 0 | 0 | 0 |
| | 55 | 56 | 5.968E-03 | 6.076E-03 | 0 | 0 | 0 | 0 |
| | 57 | 58 | 6.185E-03 | 6.293E-03 | 0 | 0 | 0 | 0 |
| | 59 | 60 | 6.402E-03 | 6.510E-03 | 0 | 0 | 0 | 0 |
| | 61 | 62 | 6.619E-03 | 6.727E-03 | 0 | 0 | 0 | 0 |
| | 63 | 64 | 6.836E-03 | 6.944E-03 | 0 | 0 | 0 | 0 |
| | 65 | 66 | 7.053E-03 | 7.161E-03 | 0 | 0 | 0 | 0 |
| | 67 | 68 | 7.270E-03 | 7.378E-03 | 0 | 0 | 0 | 0 |
| | 69 | 70 | 7.487E-03 | 7.595E-03 | 0 | 0 | 0 | 0 |
| | 71 | 72 | 7.704E-03 | 7.813E-03 | 0 | 0 | 0 | 0 |
| | 73 | 73 | 7.921E-03 | 7.921E-03 | 0 | 0 | 0 | 0 |

*Fig. 3*

| 420 | | CDF 425 426 427 428 | | | |
|---|---|---|---|---|---|
| BEC Low | BEC High | CE0 | CE1 | CE2 | CE3 |
| 0 | 0 | 0.478885 | 0.424841 | 0.394712 | 0.369709 |
| 1 | 2 | 0.993632 | 0.988084 | 0.984797 | 0.978249 |
| 3 | 4 | 0.998277 | 0.995906 | 0.995321 | 0.994038 |
| 5 | 6 | 0.999160 | 0.997325 | 0.996795 | 0.996187 |
| 7 | 8 | 0.999541 | 0.998103 | 0.997768 | 0.997135 |
| 9 | 10 | 0.999778 | 0.998515 | 0.998378 | 0.997722 |
| 11 | 12 | 0.999883 | 0.998865 | 0.998837 | 0.998266 |
| 13 | 14 | 0.999957 | 0.999211 | 0.999133 | 0.998659 |
| 15 | 16 | 0.999973 | 0.999409 | 0.999339 | 0.998919 |
| 17 | 18 | 0.999992 | 0.999545 | 0.999502 | 0.999157 |
| 19 | 20 | 0.999992 | 0.999650 | 0.999634 | 0.999320 |
| 21 | 22 | 0.999996 | 0.999743 | 0.999724 | 0.999460 |
| 23 | 24 | 0.999996 | 0.999829 | 0.999790 | 0.999569 |
| 25 | 26 | 1.000000 | 0.999864 | 0.999844 | 0.999650 |
| 27 | 28 | 1.000000 | 0.999895 | 0.999887 | 0.999732 |
| 29 | 30 | 1.000000 | 0.999914 | 0.999922 | 0.999806 |
| 31 | 32 | 1.000000 | 0.999946 | 0.999938 | 0.999848 |
| 33 | 34 | 1.000000 | 0.999957 | 0.999942 | 0.999883 |
| 35 | 36 | 1.000000 | 0.999965 | 0.999953 | 0.999903 |
| 37 | 38 | 1.000000 | 0.999977 | 0.999957 | 0.999926 |
| 39 | 40 | 1.000000 | 0.999988 | 0.999965 | 0.999934 |
| 41 | 42 | 1.000000 | 0.999992 | 0.999973 | 0.999946 |
| 43 | 44 | 1.000000 | 0.999996 | 0.999988 | 0.999973 |
| 45 | 46 | 1.000000 | 0.999996 | 1.000000 | 0.999984 |
| 47 | 48 | 1.000000 | 1.000000 | 1.000000 | 0.999992 |
| 49 | 50 | 1.000000 | 1.000000 | 1.000000 | 1.000000 |
| 51 | 52 | 1.000000 | 1.000000 | 1.000000 | 1.000000 |
| 53 | 54 | 1.000000 | 1.000000 | 1.000000 | 1.000000 |
| 55 | 56 | 1.000000 | 1.000000 | 1.000000 | 1.000000 |
| 57 | 58 | 1.000000 | 1.000000 | 1.000000 | 1.000000 |
| 59 | 60 | 1.000000 | 1.000000 | 1.000000 | 1.000000 |
| 61 | 62 | 1.000000 | 1.000000 | 1.000000 | 1.000000 |
| 63 | 64 | 1.000000 | 1.000000 | 1.000000 | 1.000000 |
| 65 | 66 | 1.000000 | 1.000000 | 1.000000 | 1.000000 |
| 67 | 68 | 1.000000 | 1.000000 | 1.000000 | 1.000000 |
| 69 | 70 | 1.000000 | 1.000000 | 1.000000 | 1.000000 |
| 71 | 72 | 1.000000 | 1.000000 | 1.000000 | 1.000000 |
| 73 | 73 | 1.000000 | 1.000000 | 1.000000 | 1.000000 |

Fig. 4B

| | | Log10(1-CDF) | | | |
|---|---|---|---|---|---|
| BEC Low | BEC High | CE0 | CE1 | CE2 | CE3 |
| 0 | 0 | -0.28307 | -0.24021 | -0.21804 | -0.20046 |
| 1 | 2 | -2.19597 | -1.92387 | -1.81808 | -1.66252 |
| 3 | 4 | -2.76361 | -2.38787 | -2.32988 | -2.22457 |
| 5 | 6 | -3.07556 | -2.57271 | -2.49422 | -2.41873 |
| 7 | 8 | -3.33813 | -2.72188 | -2.65123 | -2.54293 |
| 9 | 10 | -3.65414 | -2.82823 | -2.79001 | -2.6425 |
| 11 | 12 | -3.93289 | -2.94492 | -2.93447 | -2.76106 |
| 13 | 14 | -4.36862 | -3.1028 | -3.06184 | -2.87258 |
| 15 | 16 | -4.56492 | -3.22845 | -3.17969 | -2.96635 |
| 17 | 18 | -5.10899 | -3.34211 | -3.30293 | -3.07394 |
| 19 | 20 | -5.10899 | -3.45606 | -3.43701 | -3.16736 |
| 21 | 22 | -5.41002 | -3.59075 | -3.55888 | -3.26738 |
| 23 | 24 | -5.41002 | -3.76685 | -3.67775 | -3.36507 |
| 25 | 26 | #N/A | -3.86623 | -3.80808 | -3.45616 |
| 27 | 28 | #N/A | -3.97893 | -3.94774 | -3.57155 |
| 29 | 30 | #N/A | -4.06788 | -4.10911 | -3.71143 |
| 31 | 32 | #N/A | -4.26417 | -4.20602 | -3.81933 |
| 33 | 34 | #N/A | -4.36891 | -4.23405 | -3.93328 |
| 35 | 36 | #N/A | -4.45606 | -4.33096 | -4.01246 |
| 37 | 38 | #N/A | -4.63215 | -4.36875 | -4.13164 |
| 39 | 40 | #N/A | -4.93318 | -4.4559 | -4.17995 |
| 41 | 42 | #N/A | -5.10927 | -4.56504 | -4.26427 |
| 43 | 44 | #N/A | -5.4103 | -4.93302 | -4.5653 |
| 45 | 46 | #N/A | -5.4103 | #N/A | -4.80834 |
| 47 | 48 | #N/A | #N/A | #N/A | -5.10937 |
| 49 | 50 | #N/A | #N/A | #N/A | #N/A |
| 51 | 52 | #N/A | #N/A | #N/A | #N/A |
| 53 | 54 | #N/A | #N/A | #N/A | #N/A |
| 55 | 56 | #N/A | #N/A | #N/A | #N/A |
| 57 | 58 | #N/A | #N/A | #N/A | #N/A |
| 59 | 60 | #N/A | #N/A | #N/A | #N/A |
| 61 | 62 | #N/A | #N/A | #N/A | #N/A |
| 63 | 64 | #N/A | #N/A | #N/A | #N/A |
| 65 | 66 | #N/A | #N/A | #N/A | #N/A |
| 67 | 68 | #N/A | #N/A | #N/A | #N/A |
| 69 | 70 | #N/A | #N/A | #N/A | #N/A |
| 71 | 72 | #N/A | #N/A | #N/A | #N/A |
| 73 | 73 | #N/A | #N/A | #N/A | #N/A |

Fig. 4D

| BEC Low | BEC High | All Die (Sum 1028664) | Ratio (Sum 1.000000) | CDF | 1-CDF | Log10(1-CDF) |
|---|---|---|---|---|---|---|
| 0 | 0 | 428980 | 0.417026 | 0.417026 | 0.582974 | -0.23435 |
| 1 | 2 | 585477 | 0.569163 | 0.986189 | 0.013811 | -1.85977 |
| 3 | 4 | 9974 | 0.009696 | 0.995885 | 0.004115 | -2.38563 |
| 5 | 6 | 1524 | 0.001482 | 0.997366 | 0.002634 | -2.57946 |
| 7 | 8 | 792 | 0.000770 | 0.998136 | 0.001864 | -2.72965 |
| 9 | 10 | 475 | 0.000462 | 0.998598 | 0.001402 | -2.85331 |
| 11 | 12 | 375 | 0.000365 | 0.998963 | 0.001037 | -2.98411 |
| 13 | 14 | 285 | 0.000277 | 0.999240 | 0.000760 | -3.11907 |
| 15 | 16 | 175 | 0.000170 | 0.999410 | 0.000590 | -3.22908 |
| 17 | 18 | 143 | 0.000139 | 0.999549 | 0.000451 | -3.34576 |
| 19 | 20 | 103 | 0.000100 | 0.999649 | 0.000351 | -3.45477 |
| 21 | 22 | 84 | 0.000082 | 0.999731 | 0.000269 | -3.56979 |
| 23 | 24 | 67 | 0.000065 | 0.999796 | 0.000204 | -3.69005 |
| 25 | 26 | 45 | 0.000044 | 0.999840 | 0.000160 | -3.79479 |
| 27 | 28 | 40 | 0.000039 | 0.999878 | 0.000122 | -3.91536 |
| 29 | 30 | 33 | 0.000032 | 0.999911 | 0.000089 | -4.04849 |
| 31 | 32 | 23 | 0.000022 | 0.999933 | 0.000067 | -4.17342 |
| 33 | 34 | 13 | 0.000013 | 0.999946 | 0.000054 | -4.26409 |
| 35 | 36 | 10 | 0.000010 | 0.999955 | 0.000045 | -4.34952 |
| 37 | 38 | 10 | 0.000010 | 0.999965 | 0.000035 | -4.45597 |
| 39 | 40 | 7 | 0.000007 | 0.999972 | 0.000028 | -4.54988 |
| 41 | 42 | 6 | 0.000006 | 0.999978 | 0.000022 | -4.65055 |
| 43 | 44 | 12 | 0.000012 | 0.999989 | 0.000011 | -4.97088 |
| 45 | 46 | 6 | 0.000006 | 0.999995 | 0.000005 | -5.31330 |
| 47 | 48 | 3 | 0.000003 | 0.999998 | 0.000002 | -5.71124 |
| 49 | 50 | 2 | 0.000002 | 1.000000 | 0.000000 | #N/A |
| 51 | 52 | 0 | 0.000000 | 1.000000 | 0.000000 | #N/A |
| 53 | 54 | 0 | 0.000000 | 1.000000 | 0.000000 | #N/A |
| 55 | 56 | 0 | 0.000000 | 1.000000 | 0.000000 | #N/A |
| 57 | 58 | 0 | 0.000000 | 1.000000 | 0.000000 | #N/A |
| 59 | 60 | 0 | 0.000000 | 1.000000 | 0.000000 | #N/A |
| 61 | 62 | 0 | 0.000000 | 1.000000 | 0.000000 | #N/A |
| 63 | 64 | 0 | 0.000000 | 1.000000 | 0.000000 | #N/A |
| 65 | 66 | 0 | 0.000000 | 1.000000 | 0.000000 | #N/A |
| 67 | 68 | 0 | 0.000000 | 1.000000 | 0.000000 | #N/A |
| 69 | 70 | 0 | 0.000000 | 1.000000 | 0.000000 | #N/A |
| 71 | 72 | 0 | 0.000000 | 1.000000 | 0.000000 | #N/A |
| 73 | 73 | 0 | 0.000000 | 1.000000 | 0.000000 | #N/A |

Fig. 4E

MEMORY SUB-SYSTEM WITH BACKGROUND SCAN AND HISTOGRAM STATISTICS

TECHNICAL FIELD

The present disclosure is related to memory sub-systems. In particular, the present disclosure is related to a memory sub-system with background scan and histogram statistics.

BACKGROUND

When data is stored in memory, it is important to have a mechanism that can detect and correct a certain number of errors in the stored data. Error correction code (ECC) encodes data in such a way that errors in the data can be identified and corrected when the data is decoded. For example, data strings can be encoded by an ECC encoder by adding a number of redundant and/or parity bits to create corresponding codewords. When an original data string is to be retrieved from the memory, an ECC decoder can use the corresponding codewords to identify bit errors in the encoded data string. If bit errors are present, one or more ECC operations can be employed to correct the bit errors and to recover the original data string.

In addition to outputting error-checked and/or error-corrected data, some implementations of the ECC can also generate metadata regarding an ECC decode operation. For example, ECC operations can generate a bit error count (e.g., the number of bit errors identified and/or corrected) corresponding to a decoded codeword. Because the metadata can provide an indication of the health or quality of memory regions storing each codeword, the metadata is frequently referred to as a quality metric of the memory regions.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a table illustrating a bit error count histogram created, generated, and/or maintained by implementations of a background scan operation in accordance with the present technology.

FIGS. 4A-4D are various tables illustrating bit error count histogram statistics logs created, generated, and/or maintained by implementations of a background scan operation in accordance with the present technology and/or by other post processing operations.

FIG. 4E is a table illustrating a bit error count histogram created, generated, and/or maintained by implementations of a background scan operation in accordance with the present technology.

DETAILED DESCRIPTION

Figure 1:
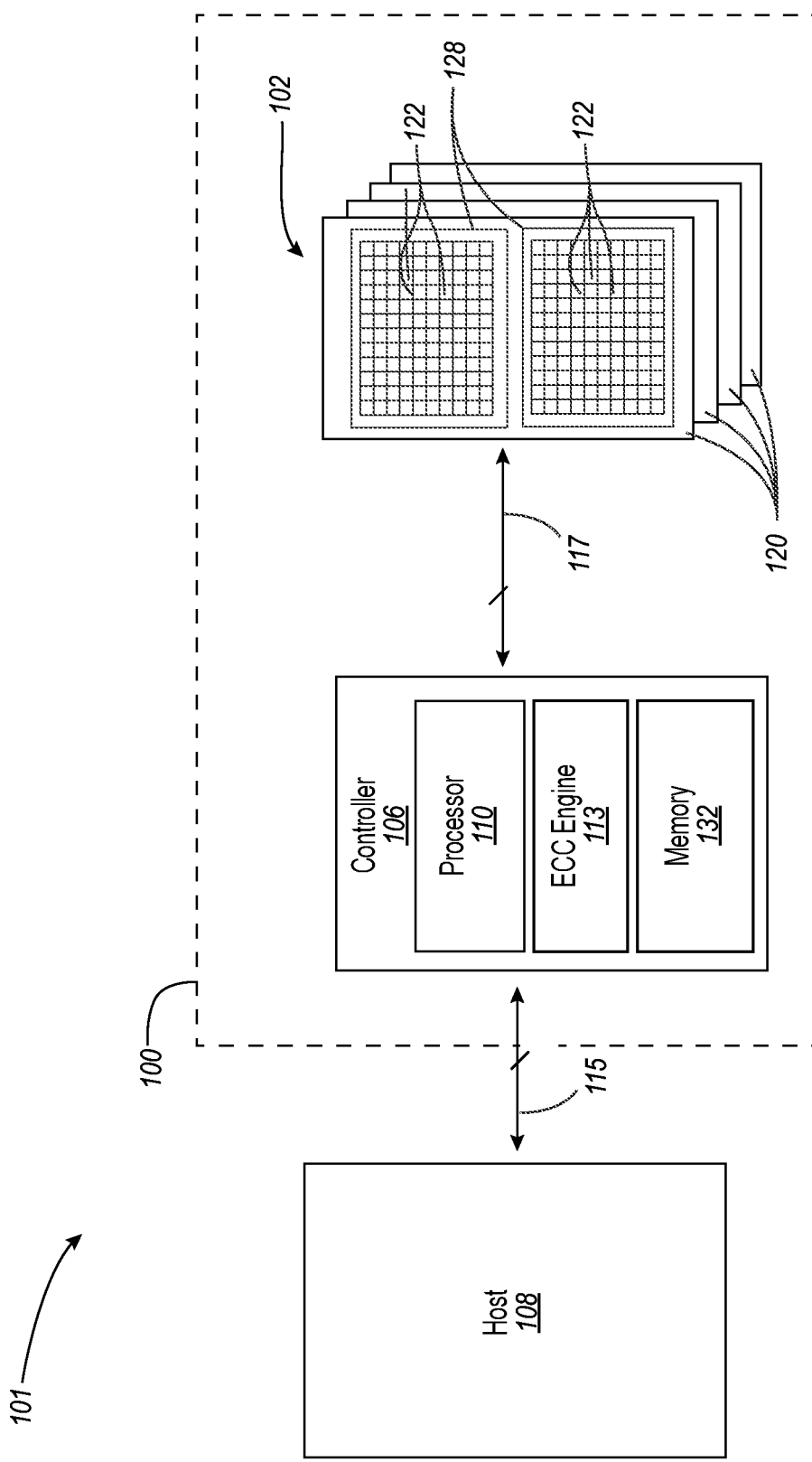
FIG. 1 is a block diagram of a system having a memory device configured in accordance with an embodiment of the present technology.

As discussed in greater detail below, the technology disclosed herein relates to memory systems and devices configured to perform a background scan operation to generate and save resulting histogram statistics. A person skilled in the art, however, will understand that the technology may have additional embodiments and that the technology may be practiced without several of the details of the embodiments described below with reference to FIGS. 1-6. In the illustrated embodiments below, the memory devices are primarily described in the context of devices incorporating NAND-based storage media (e.g., NAND flash). Memory devices configured in accordance with other embodiments of the present technology, however, can include other types of memory devices (e.g., 3D-NAND, phase change memory, ferroelectric, etc.) and/or can include main memories that are not NAND-based (e.g., NOR-based) or only partially NAND-based. Moreover, memory devices configured in accordance with still other embodiments of the present technology can include volatile memories, such as DRAM and/or SRAM memories.

In accordance with an embodiment of the present invention, quality metrics corresponding to an ECC operation can be generated and collected not only when a memory device is performing a host-initiated read operation, but can also be generated and collected in a background scan of the memory device. The background scan can involve read and ECC operations that iteratively generate quality metrics corresponding to memory regions in a memory device to build up a data set that can illustrate the health of the device. As the name implies, the background scan operation can run in the background of a memory system and/or device (e.g., during idle periods in which the memory system and/or device is not performing other operations in response to a host-initiated command). In other embodiments, a background scan operation can be performed as a foreground operation of a memory system and/or device (e.g., in response to a host-initiated command or according to a predetermined schedule). The background scan operation can iteratively read a number of pages in each memory region. During the scan, problematic and/or unreliable memory regions (e.g., memory regions with a high bit error count and/or a low margin to failure) can be identified (e.g., before a memory region fails and/or enters redundant array of independent NAND (RAIN) recovery) and can be refreshed and/or retired. In some embodiments, a background scan operation can classify a memory region as unreliable based, at least in part, on quality metrics generated while decoding codewords saved to the memory region. For example, comparing a codeword's bit error count (BEC) to a defined codeword BEC threshold can provide an indication of whether the memory region saving the codeword is reliable (e.g., even though an original data string corresponding to the codeword can currently be reconstructed and/or recovered). In these and other embodiments, the quality metrics generated while decoding a codeword and/or statistical information corresponding thereto can be saved (e.g., for analysis of the memory system and/or device, for use in other error avoidance ECC operations, etc.). In these and still other embodiments, a log of refreshed and/or retired memory regions can be saved and/or maintained (e.g., for analysis of the memory system and/or device).

In this manner, memory systems and/or devices with background scan capability can proactively identify least capable memory regions within the systems and/or devices to prevent them from becoming a trigger rate problem and/or causing an uncorrectable ECC event. Thus, memory systems and/or devices with background scan capability are expected to mitigate outlier BEC tail surprises that may be exacerbated by NAND die intolerance to retention, read disturb, cross-temperature, and/or defects. The memory systems and/or devices are also expected to save and/or provide valuable information regarding the health and/or quality of the systems and/or devices.

FIG. 1 is a block diagram of a system 101 having a memory sub-system (also hereinafter referred to as a "memory device" (e.g., memory device 100)) configured in accordance with an embodiment of the present technology. An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. As shown, the memory device 100 includes one or more memory components (e.g., memory component 102) and a controller 106 (e.g., a processing device) operably coupling the memory component 102 to a host device 108 (e.g., an upstream central processor (CPU)). The memory component 102 includes a plurality of memory regions, or memory units 120, which include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, NAND flash and/or other suitable storage elements (e.g., NOR flash, read only memory (ROM), electrically erasable programmable ROM EEPROM, erasable programmable ROM (EPROM), ferroelectric, magnetoresistive, phase change memory, etc.) configured to store data persistently or semi-persistently. The memory component 102 and/or the individual memory units 120 can also include other circuit components (not shown) (e.g., memory subsystems), such as multiplexers, decoders, buffers, read/write drivers, address registers, data out/data in registers, etc., for accessing and/or programming (e.g., writing) the memory cells 122 and other functionality, such as for processing information and/or communicating with the controller 106 via a device bus 117.

The controller 106 can be a microcontroller, special purpose logic circuitry (e.g., a field programmable gate array (FPGA), an application specific integrated circuit (ASIC), etc.), or other suitable processor. The controller 106 can include a processor 110 configured to execute instructions stored in memory, such as ECC operations. The processor 110 can be a processing device. In the illustrated example, the controller 106 includes an embedded memory 132 configured to store various processes, logic flows, and routines for controlling operation of the memory device 100, including managing the memory component 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. In operation, the controller 106 can directly read, write, or otherwise program (e.g., erase) the various memory regions of the memory component 102, such as by reading from and/or writing to groups of memory cells 122 (e.g., memory pages, stripes of memory pages, memory blocks 128, etc.).

The controller 106 communicates with the host device 108 over a system bus 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). In some embodiments, the host device 108 can send various vendor specific (VS) commands to perform one or more restricted operations (e.g., access a restricted region of the memory component 102, enter a debugging mode, reset restricted data, etc.).

The memory device 100 can further include ECC hardware, such as an ECC engine 113, configured to encode and/or decode data stored in the memory component 102. In the illustrated embodiment, the ECC engine 113 is located on the controller 106. In other embodiments, the ECC engine 113 can be located on the memory component 102 and/or various components of the ECC engine 113 can be spread over the memory component 102 and the controller 106. In some embodiments, the ECC engine 113 can be a Bose-Chaudhuri-Hocquenghem (BCH) ECC engine and/or a low-density parity check (LDPC) ECC engine. In these and other embodiments, the ECC engine 113 can be a Reed-Solomon (RS) ECC engine, a tightly-coupled memory (TCM) ECC engine, and/or another type of ECC engine. In these and still other embodiments, the ECC engine 113 can include an ECC encoder (not shown) and/or an ECC decoder (not shown).

The ECC engine 113 (e.g., the encoder and/or the ECC decoder) are configured to encode and decode, respectively, data stored in the memory component 102 of the memory device 100 (e.g., to detect and/or correct errors in data read out from, written to, and/or stored in the memory component 102). More specifically, the ECC engine 113 is configured to encode data in accordance with one or more ECC approaches (e.g., block codes, convolution codes, and others) to create codewords. For example, the ECC engine 113 can encode a data string by adding a number of redundant and/or parity bits to the data string. In a specific example, the ECC engine 113 can encode a data string with k number of bits into a block with n number of bits having k-n parity bits in accordance with a block ECC. Blocks with parity bits in this example are called codewords. Codewords created by the ECC engine 113 are written to memory regions in the memory component 102. In some embodiments, each memory page in the memory component 102 of the memory device 100 is configured to store four codewords. In other embodiments, each memory page is configured to store 16 codewords. In still other embodiments, the number of codewords a memory page is configured to store can vary. For example, memory pages in other embodiments can be configured to store a greater (e.g., 17 or more) or lesser (e.g., 15 or less and/or three or less) number of the codewords per memory page.

When one or more codewords are read out from the memory component 102 (e.g., during an access and/or a scan operation of the memory device 100), the ECC engine 113 (e.g., the ECC decoder) decodes each codeword to reconstruct the original data string(s). As described in greater detail below, the controller 106 can scan the memory component 102 (e.g., by die, by block, by memory page, by stripes of memory pages, etc.) to ensure data stored on the memory component 102 and/or on the embedded memory 132 has not and/or will not become corrupted (e.g., as part of a manufacturing and/or end-user error avoidance operation of the memory device 100). The scan function can be similar to an accessing function of the memory device 100 in that one or more codewords are read from the memory component 102. Thus, the ECC engine 113 is used to decode each codeword read into the controller 106 under an access operation and a scan operation of the memory device 100. The scan operation differs from the access operation, however, in that original data strings reconstructed from the codewords are not typically output to the host device 108.

The ECC engine 113 uses the codewords (e.g., the parity bits) of each data string to provide an indication of whether there are bit errors in the data string. A bit error, or bit flip, occurs if a bit is read in a first logic state (e.g., "0") when the bit was intended to be in a second logic state (e.g., "1"). Similarly, a bit error occurs if a bit is read in the second logic state when the bit was intended to be in the first logic state. Common reasons for bit errors include writing the data string to memory at elevated temperatures and/or reading the data strings from memory in the presence of a large amount of noise. Other reasons for bit errors include defects in the memory cells 122 storing the bits of data. If one or more bit errors are present in an encoded data string, normal ECC decode processing of the ECC engine 113 can be employed to correct the bit errors and to clear the encoded data string (e.g., the codeword). If, however, the number of bit error present in an encoded data string exceeds the error correction capability (e.g., 80 bit errors) of the normal ECC decode processing, the normal ECC decode processing will not be sufficient to clear the encoded data string. In this event, one or more error recovery ECC operations can be employed to reduce the number of bit errors in the encoded data string to within the error correction capability of the normal ECC decode processing (e.g., 80 bit errors or less) such that the ECC engine can correct the remaining bit error, clear the codeword, and recover the original data string. Examples of error recovery ECC operations include read retry without an offset, read retry with various sizes of offsets, hard low-density parity check, soft low-density parity check, corrective read, auto calibration with various levels of persistence, and/or RAIN recovery operations. In some embodiments, the ECC engine 113 provides original, decoded data strings to the processor 110 and/or to other components of the controller 106 (e.g., to output the original, decoded data strings to the host device 108).

During an ECC decode operation, the ECC engine 113 can also generate metadata regarding codewords and/or memory regions (e.g., memory dies, memory units 120, memory blocks 128, memory pages, stripes of memory pages, memory cells 122, etc.) of the memory component 102 where the codewords are saved. For example, the ECC engine 113 can generate metadata including (i) a location (e.g., a memory region) in memory where a codeword is stored; (ii) whether errors are detected in the codeword, (iii) the number of bit errors present in the codeword (i.e., the number of bit errors that need to be corrected in order to clear a codeword and to recover an original data string); and/or (iv) whether bit errors have been encountered in the corresponding memory region in the past. If the ECC engine 113 determines that there are bit errors present in a codeword, the ECC engine 113 can employ one or more error recovery ECC operations to correct the bit errors in the codeword and to recover the original data string. As a result, the ECC engine 113 can generate additional metadata, such as (i) error recovery ECC operations used to recover the original data string; (ii) how much energy was consumed by the error recovery ECC operations; (iii) an amount of time (e.g., processing time) required to recover the original data string; and/or (iv) whether the codeword contained uncorrectable bit errors (e.g., a UECC event). Because the metadata can provide an indication of the health or quality of memory regions storing each codeword, the metadata is frequently referred to as a quality metric of the memory regions.

In some embodiments, quality metrics can be used by the controller for ECC validation and/or debugging operations. In these and other embodiments, quality metrics can be used by the controller 106, other components of the memory device 100, and/or the host device 108 in several other operations of the memory device 100. For example, continuous read level calibration (cRLC), dynamic program target (DPT) calibration, dynamic program step (DPS) calibration, and the like are error avoidance ECC operations that utilize quality metrics during the manufacture or operation of the memory device 100 to calibrate memory regions (e.g., memory cells 122, memory pages, memory blocks 128, memory die 120, etc.) thereof. Additionally or alternatively, several error avoidance ECC operations of an end-user memory device 100 can utilize quality metrics to operate more efficiently and/or effectively. For example, DPT for read window budget (RWB) measurements and improvements, and power loss recovery procedures each use quality metrics of the codewords as error avoidance ECC operations within an end-user memory device 100.

Figure 2:
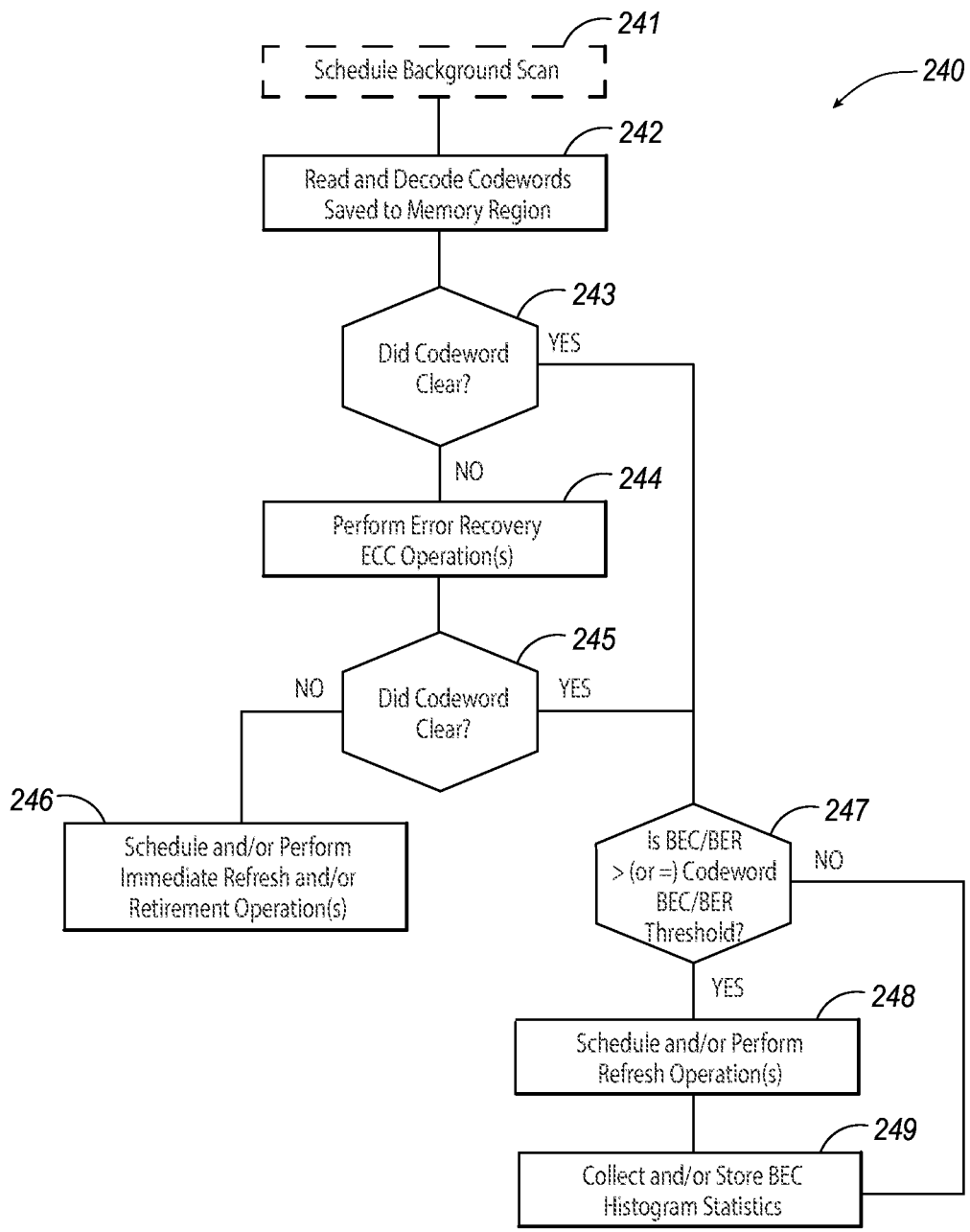
FIG. 2 is a flow diagram illustrating a background scan routine that is executed, at least in part, by a memory device in accordance with the present technology.

FIG. 2 is a flow diagram illustrating a routine 240 directed to a method of collecting quality metrics regarding one or more codewords of data stored in a memory region of a memory device (e.g., the memory device 100) in accordance with an embodiment of the present technology. In some embodiments, the routine 240 can be carried out by components of a memory device controller (e.g., the processor 110, the ECC engine 113, and/or the embedded memory 132 of the controller 106) and/or components of a memory component (e.g., the memory component 102 of the memory device 100). In these and other embodiments, all or a subset of the steps of the routine 240 (e.g., blocks 241-249) can be performed by other components of the memory device 100 by components of a host device (e.g., the host device 108) and/or other components of the system 101. The routine 240 illustrated in FIG. 2 (e.g., all or a subset of the blocks 241-249) is referred to herein as a background scan operation of the memory device 100. It should be noted, however, that all or a subset of the steps of the routine 240 can be performed in the background and/or in the foreground of the memory device 100, the host device 108, and/or the system 101, as discussed in greater detail below.

In the embodiment illustrated in FIG. 2, the routine 240 can begin at block 241 by scheduling execution of all or a subset of the blocks 242-249 of the routine 240. For example, the routine 240 can schedule all or a subset of the blocks 242-249 to be performed at a particular cadence on the memory device 100. In some embodiments, the cadence can be event based such that all or a subset of the blocks 242-249 are executed after certain events and/or a certain number of events have occurred (e.g., after the memory device 100 and/or the host device 108 are powered on; after a certain number of boot cycles; after an input/output event has occurred; after a certain number of input-output events have occurred, etc.). In these and other embodiments, the cadence can be time-based such that all or a subset of the blocks 242-249 are executed after a certain amount of time has elapsed (e.g., at regular intervals). For example, the routine 240 can schedule execution of all or a subset of the blocks 242-249 such that memory regions on each memory block 128, memory superblock, and/or memory die 120 of the memory device 100 are sampled in a day. In these and other embodiments, the time intervals can be measured from certain events, such as the last time all or a subset of the blocks 242-249 were executed, interrupted, delayed, ignored, canceled, and/or overwritten. Additionally or alternatively, the routine 240 can schedule execution of all or a subset of the blocks 242-249 to be run as background and/or foreground operations of the memory device 100. For example, the routine 240 can schedule execution of all or a subset of the blocks 242-249 such that all or a subset of the blocks 242-249 are performed only when and/or while the host device 108 and/or the memory device 100 is offline and/or is in an idle state (e.g., so as not to interfere with foreground operations of the memory device 100 and/or with operations of the host device 108).

In some embodiments, the routine 240 can automatically schedule execution of all or a subset of the blocks 242-249 (e.g., when the memory device 100 and/or the host device 108 are powered on). In these and other embodiments, the routine 240 can wait to receive a command (e.g., a VS command from the host device 108) to schedule execution of all or a subset of the blocks 242-249. In these and still other embodiments, the routine 240 can adjust (e.g., alter, modify, overwrite, etc.) a previously established schedule and/or the cadence. For example, the schedule and/or the cadence of execution of the blocks 242-249 of the routine 240 can be preset (e.g., during manufacture of the memory device 100) and/or can be previously established (e.g., in a previous iteration of the routine 240). In these embodiments, the routine 240 can send a VS command (e.g., from the host device 108) to adjust the preset and/or previously established schedule and/or cadence, and/or the routine 240 can wait to receive a VS command before adjusting the preset and/or previously established schedule and/or the cadence. In these and still other embodiments, the routine 240 can schedule and/or adjust a previously established schedule based on the occurrence of specific events (e.g., refresh events), as described in greater detail below with respect to blocks 246 and 248.

After the routine 240 schedules execution of all or a subset of the blocks 242-249, the routine 240 can wait to receive a command to perform a background scan (e.g., a command to execute all or a subset of blocks 242-249) before proceeding to block 242. For example, the routine 240 can be continuously running (e.g., in the background of the memory device) such that the routine 240 is configured to receive one or more commands to perform a background scan at block 241 in accordance with the schedule and/or the cadence established by the routine 240. In these and other embodiments, the routine can automatically proceed to block 242 after the routine 240 establishes a background scan schedule and/or cadence.

Additionally or alternatively, the schedule and/or cadence can be preset (e.g., established during manufacture of the memory device 100) such that the routine 240 can begin at block 242 when it receives a command to perform a background scan in accordance with the preset schedule and/or cadence. In these and other embodiments, the routine 240 can begin at block 242 in response to a command to perform a background scan sent and/or received in relation to a refresh and/or retirement event of one or more memory regions, as described in greater detail below with respect to blocks 246 and 248. In these and still other embodiments, the routine 240 can begin at block 242 when the command to perform a background scan is a VS command (e.g., from the host device 108). For example, the routine 240 can receive a VS command to perform a background scan (e.g., immediately, the next time the system 101 is idle and/or offline, etc.) on the entire memory device 100 or on select memory regions (e.g., filled super blocks, partially filled superblock, a particular memory die, a particular memory block 128, etc.) in the memory device 100.

At block 242, the routine reads and decodes codewords saved to a memory region of the memory component 102. In some embodiments, the memory region is a memory block (e.g., a memory block 128) on a memory unit (e.g., memory unit 120) of the memory component 102. In these embodiments, the memory unit 120 can be a memory die, a memory plane in a single memory die, or the like. In other embodiments, the memory region can be a memory page in a memory block 128. In still other embodiments, the memory region can be a stripe of memory pages (e.g., from a superblock and/or across one or more memory blocks 128, across one or more superblocks, across one or more memory die 120, etc.).

In some embodiments, the routine 240 can select the memory region according to specified criteria. For example, the memory region can be a memory page stripe across a superblock, and the routine 240 can be configured to select a memory page stripe from the oldest fully programmed super block in the memory device 100 (e.g., listed in a queue). In a next iteration of the routine 240, the routine 240 can select a next memory page stripe in the oldest fully programmed superblock and/or can select a memory page stripe across the next oldest fully programmed superblock in the memory device 100. In these and other embodiments, if the oldest fully programmed superblock is in the process of being folded, refreshed, and/or retired (as described in greater detail below), the routine 240 can skip that superblock and move to a memory page stripe in the next oldest superblock in the memory device 100. In these and other embodiments, the routine 240 can select a memory region according to other criteria. For example, routine 240 can select a memory region that stores only end-user data. In other embodiments, the routine 240 can select a memory region that stores end-user data and/or system data (e.g., firmware data, data in restricted regions of memory, microcode, and/or various processes, logic flows, and/or routines for controlling operation of the memory device 100). In these and still other embodiments, the routine 240 can select a memory region (e.g., a memory page stripe) storing data (i) that is of a similar age, (ii) that is of a similar type, (iii) that was programmed at a similar temperature, and/or (iv) that is read at a similar temperature. In these embodiments, the routine 240 ensures that data stored in the memory region is representative of all data stored in adjacent regions of the memory component 102 (e.g., of all data stored in a memory block 128 containing at least a portion of the memory page stripe). This can help ensure that the routine 240 covers all expected usage cases and/or the majority of NAND disturb mechanism of each memory die 120 and/or memory block 128 in the memory device 100. In these and still other embodiments, the routine 240 can treat all memory regions as equal and/or can randomly or sequentially select a memory region (e.g., to ensure that there is not an assumption a memory region might need to be refreshed and/or retired).

In other embodiments, the memory region can be specified in the command to perform a background scan at block 241 and/or 242. For example, a command can direct the routine 240 to perform a background scan on the entire memory device 100 and/or on a particular memory region in the memory device 100 (e.g., on a particular memory die 120, on a particular memory block 128, on a particular memory page, on a particular memory page stripe, etc.). In these and other embodiments, the VS command can specify a criteria for selecting a memory region. For example, the command can direct the routine 240 to perform a background scan on only fully filled superblocks and/or on partially filled superblocks (e.g., to combat erased state charge gain on the partially filled superblocks).

Once a memory region has been selected, the routine 240 can read and decode codewords saved in the memory region. For example, in embodiments where the memory region is a memory page stripe from a superblock that spans multiple memory die 120 (e.g., 16 memory die 120) and every plane in each die (e.g., four planes per memory die 120), the routine 240 can read codewords stored on a memory page in each plane in each memory die 120 (e.g., for a total of 64 memory pages). In the numeric example provided, if each memory page contains eight codewords per memory page, the routine 240 can read and decode 512 codewords in one or more iterations of the routine 240. In some embodiments, the routine 240 can serially read and/or decode the codewords stored in the memory region. In these and other embodiments, the routine 240 can read and/or decode the codewords in parallel. In embodiments where the memory device 100 contains a first page read (e.g., a transient Vt) issue prior to a page read sense that collects the codeword BEC information from a new memory block, the routine 240 can perform a dummy page read sense to ensure the correct codewords and corresponding quality metric data (described below) is produced and/or saved. Additionally or alternatively, in embodiments where the memory region is a partially filled, triple level cell (TLC) superblock, the routine 240 can read codewords from a sample of programmed extra memory pages (XP) and/or can perform an erase page check on a sample of erased lower page (LP). This can help counter erased state charge gain on the partially filled superblocks.

In some embodiments, the routine 240 decodes the codewords using an ECC engine on the memory device 100 (e.g., the ECC engine 113 on the controller 106). In these embodiments, the ECC engine 113 (e.g., the ECC decoder) can decode each codeword and can generate quality metrics regarding each codeword and/or corresponding memory regions storing the codewords. As described above, the quality metrics can include (i) a location (e.g., a memory region, a physical address, a logical address, etc.) in the memory region where a codeword is stored; (ii) whether errors are detected in the codeword, and/or (iii) the bit error count (BEC) of the codeword (e.g., the number of bit errors present in the codeword and/or the number of bit errors that need to be corrected in order to clear a codeword and to recover an original data string).

At block 243, the routine 240 (for each codeword) determines whether the codeword cleared. For example, the routine 240 can determine whether all bit errors (if any) present in the codeword were successfully corrected (e.g., using the error correction capability of normal ECC decode processing) when the routine 240 decoded the codeword at block 242 such that the codeword cleared and the original data string was recovered. If the routine 240 determines that the codeword cleared, the routine 240 can proceed to block 247 to compare the bit error count (BEC) or the bit error rate (BER) of the codeword (e.g., included in the quality metrics generated at block 242) to a codeword BEC/BER limit in accordance with the discussion below. The routine 240 considers codewords read without bit errors and/or codewords with a BEC/BER below the codeword BEC/BER limit to be reliable and to have little chance of being uncorrectable in future reads. On the other hand, if the routine 240 determines that the codeword did not clear (block 243), the routine 240 can proceed to block 244 to attempt to correct bit errors in the codeword.

At block 244, the routine 240 attempts to correct bit errors in a codeword. For example, the routine 240 can attempt to correct bit errors in the codeword to bring the number of bit errors in the codeword within (e.g., less than or equal to) the error correction capability of normal ECC decode processing such that normal ECC decode processing can clear the codeword. In the illustrated embodiment, the routine 240 can attempt to correct bit errors only by rereading the codeword from the memory region (e.g., with zero offsets) and/or by performing cRLC. This error recovery ECC operation is referred to as RRO herein. In other embodiments, the routine 240 can perform one or more other error recovery ECC operations in addition to or in lieu of the RRO operation. After performing the error recovery ECC operation(s) (e.g., the RRO operation), the routine 240 (i) can generate corresponding quality metrics regarding the codeword and/or the corresponding memory region and/or (ii) can proceed to block 245. In some embodiments, the corresponding quality metrics can include (i) error recovery ECC operation(s) used to recover an original data string; (ii) how much energy was consumed by the error recovery ECC operation(s); (iii) an amount of time (e.g., processing time) required to recover the original data string; and/or (iv) whether the codeword contained uncorrectable bit errors (i.e., an UECC event). In some embodiments, these quality metrics can be generated in addition to the quality metrics discussed above with respect to block 242.

At block 245, the routine 240 can determine whether the error recovery ECC operation(s) performed at block 244 corrected bit errors in the codeword such that the codeword cleared. For example, the routine 240 can determine whether the error recovery ECC operation(s) successfully brought the number of bit errors in the codework to within the error correction capability of normal ECC decode processing such that the normal ECC decode processing cleared the codeword and recovered the original data string. If the routine 240 determines that the codeword cleared, the routine 240 can proceed to block 247 to compare the BEC of the codeword (e.g., included in the quality metrics generated at block 242 and/or 244) with a codeword BEC threshold, as described below. On the other hand, if the routine 240 determines that the codeword did not clear (e.g., that the error recovery ECC operation(s) did not correct (e.g., enough) bit errors in the codeword (block 245) to clear the codeword), the routine 240 can classify the codeword as unreliable and/or uncorrectable (UECC) (e.g., UECC at RRO) and/or can proceed to block 246.

At block 246, the routine 240 can schedule an immediate refresh operation for and/or perform the immediate refresh operation on the memory region storing the uncorrectable codeword. In the illustrated embodiment, the routine 240 considers a codeword classified as unreliable and/or uncorrectable (e.g., a codeword that has failed to be successfully read at RRO) to be unreliable in its current state and in need of an immediate refresh operation (e.g., a garbage collection operation). In these embodiments, the routine 240 considers the corresponding memory regions to be unreliable even if original data corresponding to the uncorrectable codeword can be reconstructed using one or more additional error recovery ECC operations. In this manner, the routine 240 can identify memory regions with a low margin to failure, and/or the routine 240 can relocate and/or refresh (e.g., all or a subset of) the memory regions before the memory regions become problematic.

In some embodiments, the immediate refresh event can include subjecting the UECC codeword to all or a subset of error recovery ECC operations remaining on and/or available to the memory device 100 (e.g., error recovery ECC operations not performed at block 244, one or more error recovery ECC operations in a specified order, and/or one or more error recovery ECC operations until original data corresponding to the UECC codeword is recovered). In these and other embodiments, the immediate refresh event can include moving original data (e.g., stored on all or a subset of the corresponding memory block, on all or a subset of the corresponding memory region, at the corresponding memory location of the codeword on the memory region, etc.) to another memory region in the memory device 100. In these and still other embodiments, the immediate refresh operation can include making the memory region (e.g., the corresponding memory block, the corresponding memory region, and/or the corresponding memory location) available to store new data once the original data has been relocated to another memory region. In still other embodiments, the immediate refresh operation can include retiring the memory region (e.g., if one or more codewords stored in the memory region have been classified as UECC in the past and/or if the original data corresponding to the UECC codeword cannot be recovered and/or enters RAIN recovery after executing the remaining and/or available error recovery ECC operations on the codeword). In some embodiments, the routine 240 can save an indication of the memory location of a UECC codeword in memory (e.g., in one or more logs storing a list of refreshed and/or retired memory regions). In these and other embodiments, the indication can be used by the memory device 100 (e.g., by the controller 106) for post-processing analysis.

In the illustrated embodiment, the routine 240 does not proceed from block 246 to block 249. As a result, a UECC codeword's BEC information is not collected and/or aggregated into a BEC histogram created, generated, and/or maintained at block 249, (described in greater detail below). Instead, the routine 240 can return from block 246 to blocks 241 and/or 242. For example, the routine 240 can return to block 241 to schedule a subsequent (e.g., immediate) background scan operation. In some embodiments, the routine 240 can ignore, overwrite, adjust, modify, and/or delay the previously established and/or preset schedule and/or cadence. In other embodiments, the routine 240 can return to block 241 to await a subsequent command to perform a background scan (e.g., while another operation of the memory device performs the immediate refresh operation). The subsequent command can direct the routine 240 to perform a background scan operation on the same or a different memory region. In still other embodiments, the routine 240 can be paused (e.g., until the immediate refresh operation is complete) and/or can be resumed at block 242 to read and/or decode the next codeword in the memory region. In these and other embodiments, the routine 240 can be terminated and/or can be restarted (e.g., at block 241 or block 242) once the immediate refresh operation is complete. In some embodiments, the routine 240 can read and/or decode the next codeword in the same memory region, and/or the routine 240 can read a first codeword in a different memory region. Alternatively, in some embodiments, the routine 240 can proceed from block 246 to block 249 to collect a UECC codeword's BEC information in a BEC histogram (e.g., created, generated, and/or maintained at block 249, as described in greater detail below).

Returning again to block 245 of the routine 240, if the routine 240 determines that the codeword cleared after error recovery ECC operation(s) were performed at block 244, the routine 240 can proceed to block 247. At block 247, the routine 240 can compare the BEC of a codeword to a codeword BEC threshold and/or a corresponding codeword bit error rate (BER) threshold. In some embodiments, the codeword BEC/BER threshold is dependent on components of the memory device 100. For example, the routine 240 can define the codeword BEC/BER threshold such that it is less than or equal to the BEC/BER capability of the ECC engine 113. In embodiments where the memory device 100 has a LDPC ECC engine 113, for example, the routine 240 can define the codeword BEC/BER threshold such that it is less than or equal to a hard read threshold of the ECC engine 113 (e.g., such that the codeword BEC/BER threshold for a codeword size of 2292 data bytes is less than or equal to 140/7.635e-3, less than or equal to 90/4.908e-3, or less than or equal to another codeword BEC/BER threshold). In some embodiments, the routine 240 can define the codeword BEC/BER threshold less than (e.g., much less than) BEC/BER capability of the ECC engine 113 such that the routine 240 considers any codeword with a BEC/BER greater than and/or equal to the codeword BEC/BER threshold as unreliable even though the ECC engine 113 can correct bit errors in the codewords. In these and other embodiments, the routine 240 can define the codeword BEC/BER threshold during the manufacture of the memory device 100. In these and other embodiments, the routine 240 can define and/or redefine the codeword BEC/BER threshold on an end-user memory device 100. For example, the routine 240 can direct the memory device 100 to define the codeword BEC/BER threshold. In some embodiments, the routine 240 can require a VS command (e.g., from the host device 108) to define and/or redefine the codeword BEC/BER threshold (e.g., during manufacture of the memory device 100 and/or on an end-user memory device 100). In these and other embodiments, the routine 240 can define and/or redefine the codeword BEC/BER threshold (e.g., based at least in part on quality metrics regarding memory regions of the memory device 100).

When comparing the BEC/BER of a codeword to the codeword BEC/BER threshold at block 247, the routine 240 determines whether the BEC/BER of a codeword is greater than or equal to the codeword BEC/BER threshold. In some embodiments, the routine 240 can determine whether the BEC/BER of a codeword is strictly greater than the codeword BEC/BER threshold. If the routine 240 determines that the BEC/BER of a codeword in the memory region is less than (or equal to) the codeword BEC/BER threshold, the routine 240 can proceed to block 249 to collect histogram data regarding the codeword and/or the corresponding memory region, as described in greater detail below with respect to block 249. The routine 240 considers these codewords to be reliable and to have a low chance of being uncorrectable in future reads. Thus, the routine 240 in the illustrated embodiment does not schedule and/or perform a refresh operation for the corresponding memory region based on these codewords. On the other hand, if the routine 240 determines that the BEC/BER of a codeword is greater than (or equal to) the codeword BEC/BER threshold, the routine 240 can proceed to block 248.

At block 248, the routine 240 can schedule a BEC threshold refresh operation for and/or perform the BEC threshold refresh operations on a memory region storing a codeword having a BEC greater than (or equal to) the codeword BEC threshold. In the illustrated embodiment, the routine 240 considers a codeword having a BEC/BER greater than (or equal to) the codeword BEC/BER threshold to be at risk for a future ECC failure and in need of a refresh operation (e.g., a garbage collection operation and/or a retirement operation) before the codeword becomes an ECC failure. In other words, the routine 240 considers these codewords to be reliable but having an unacceptably high chance of being uncorrectable in future reads. In some embodiments, the routine 240 at block 248 can be similar to the routine 240 at block 246 with the exception that the BEC threshold refresh operation need not be performed immediately. For example, the routine 240 at block 248 can schedule a BEC threshold refresh operation for (e.g., all or a subset of) the memory region at a future time (e.g., after a certain amount of time has elapsed, after a certain event has occurred, and/or after a certain number of events have occurred). In other embodiments, the routine 240 can schedule an immediate refresh operation for and/or perform an immediate refresh operation on (e.g., all or a subset of) the corresponding memory region. In these embodiments, the routine 240 at block 248 can be the same as the routine 240 at block 246. In some embodiments, the routine 240 can save an indication of the memory location of a codeword having a BEC/BER greater than (or equal to) the codeword BEC/BER threshold in memory (e.g., in one or more logs storing a list of refreshed and/or retired memory regions). In these and other embodiments, the indication can be used by the memory device 100 (e.g., by the controller 106) for post-processing analysis.

At block 249, the routine 240 (i) collects BEC information and/or (ii) creates, generates, and/or maintains a BEC histogram storing statistical information about the BEC. As discussed above, the routine 240 illustrated in FIG. 2 is configured to collect and/or save BEC information (i) of codewords in which no bit errors are present (block 243) and/or (ii) of codewords in which bit errors are present (block 243) but are correctable by one or more error recover ECC operations (e.g., RRO) (block 245). This includes BEC information of codewords having a BEC/BER greater than (or equal to) and/or less than (or equal to) the codeword BEC/BER threshold (block 247). In other words, the routine 240 in the illustrated embodiment is configured to collected BEC information of all decoded codewords (e.g., with the exception, in some embodiments, of uncorrectable codewords). In other embodiments, the routine 240 can be configured to collect BEC information of UECC codewords (e.g., in addition to or in lieu of BEC information of other codewords), and/or the routine 240 can be configured to not collect BEC information of codewords meeting other criteria (e.g., of codewords with no identified bit errors, of codewords with a BEC greater than (or equal to) the codeword BEC threshold, of codewords with a BEC lesser than (or equal to) the codeword BEC threshold, etc.).

FIG. 3 is a table illustrating a BEC histogram 370 generated and/or maintained by one implementation of the routine 240 in accordance with an embodiment of the present technology. In some embodiments, the routine 240 can save the BEC histogram 370 in nonvolatile memory regions (e.g., the memory component 102, the embedded memory 132, and/or one or more other memory regions) of the memory device 100. As shown in FIG. 3, the BEC histogram 370 includes a plurality of columns 371-378 and a plurality of rows 380. In the illustrated embodiment, the routine 240 collects and saves BEC count information regarding codewords stored on four memory die 120 (e.g., of the memory device 100). These memory die 120 (i.e., CE0, CE1, CE2, and CE3) are individually represented by columns 375, 376, 377, and 378, respectively, in the BEC histogram 370. In this embodiment, codewords are encoded (e.g., using the ECC engine 113) in such a way that 73 bits errors represents a maximum possible amount of bit errors in a codeword before which the codeword triggers a failure event (e.g., RAID event) and/or original data corresponding to the codeword is unrecoverable. In other words, all BEC counts added to the histogram 370 stem from codewords having a BEC between zero bit errors and 73 bit errors. As described in greater detail below with respect to FIG. 5, a UECC limit can be set less than or equal to 73 bit errors such that codewords trigger a failure event before entering a RAID event and/or before corresponding original data becomes unrecoverable. The columns 371 and 372 of the BEC histogram 370 in FIG. 3 break the range of possible codeword bit error counts down into bins. In particular, each row (e.g., rows 382 and 383) in columns 371 and 372 of the BEC histogram 370 (with the exception of the first row (e.g., row 381) and the last row) contains two BEC possibilities. For example, the row 382 of the columns 371 and 372 defines a BEC bin with a low BEC possibility of 1 bit error (column 371) and a high BEC possibility of 2 bit errors (column 372). Similarly, the row 383 of the columns 371 and 372 defines a BEC bin with a low BEC possibility of 3 bit errors (column 371) and a high BEC possibility of 4 bit errors (column 372). The row 381 and the last row in the rows 380 of the columns 371 and 372 define a BEC bin with only one BEC possibility (i.e., a BEC of 0 bit errors and a BEC of 73 bit errors, respectively). Thus, the BEC low possibility (column 371) and the BEC high possibility (column 372) for these BEC bins are the same in these rows. The rows 380 of the columns 373 and 374 in the BEC histogram 370 define BER bins having low BER possibilities (column 373) and high BER possibilities (column 374) corresponding to the low BEC possibilities and the high BEC possibilities, respectively, of the BEC bins defined by the rows 380 of the columns 371 and 372, respectively.

As discussed above, the routine 240 can generate quality metrics for each decoded codeword (e.g., at blocks 242 and/or 243). The quality metrics can include a BEC for each decoded codeword in each iteration of the routine 240. In the embodiments illustrated in FIGS. 2 and 3, the routine 240 tracks how many decoded, non-UECC codewords in each memory die 120 (i.e., CE0-CE3) have BEC values corresponding to the BEC bins in the BEC histogram 370. Referring to FIG. 3, for example, the routine 240 has decoded 123,097 codewords in the memory die CE0 having zero bit errors. For each of these occurrences, the routine 240 has increased (by one) a counter value saved in the row 381 (i.e., the row defining a BEC bin including the zero bit errors possibility) of the column 375 (i.e., the column corresponding to the memory die CE0) in the BEC histogram 370. Similarly, the routine 240 (i) has decoded 132,315 codewords in the memory die CE0 having between one and two bit errors and (ii) has increased (by one) the counter value in the row 382 of the column 375 each time. As shown in cell 379 in FIG. 3, the routine 240 can keep a total number of decoded codewords per memory die. For example, the routine 240 can increase a counter value stored in the cell 379 of the BEC histogram 370 each time a counter value in the rows 380 of the column 378 is increased. In these and other embodiments, the routine 240 can save other quality metrics (e.g., a memory location corresponding to each codeword) to the BEC histogram 370. As described in greater detail below, the total number of decoded codewords per memory die can be used to create, generate, and/or maintain additional BEC logs.

Although the routine 240 in the illustrated embodiment saves codeword BEC information in the BEC histogram 370 on a memory die 120 basis, the routine 240 in other embodiments can save codeword BEC information in the BEC histogram 370 on a different basis (e.g., by memory channel, by memory device 100, by superblock, by memory block 128, by memory page, by host device 108, etc.). In these and other embodiments, the routine 240 can create, generate, and/or maintain the BEC histogram 370 for a greater (e.g., 4 or more) and/or lesser (e.g., 3 or less) number of memory die 120. In these and still other embodiments, the routine 240 can create, generate, and/or maintain the BEC histogram 370 with a greater (e.g., 75 or more) and/or lesser (e.g., 73 or less) number of BEC possibilities, with greater and/or smaller bin sizes, and/or with different bin scales (e.g., a logarithm bin scale). For example, the routine 240 can create, generate, and/or maintain a BEC histogram 370 with BEC bins having a bin size of one bit error such that each BEC bin contains one BEC possibility (i.e., there are 74 BEC bins for 74 bit error possibilities). In these embodiments, the routine 240 can create, generate, and/or maintain a BEC histogram without the column 371 or the column 372 illustrated in FIG. 3. In other embodiments, the routine can create, generate, and/or maintain a BEC histogram 370 with rows 380 having a bin size of four bit error possibilities. For example, the row 382 of the columns 371 and 372 of the BEC histogram 370 can define a BEC bin with a low BEC possibility of one bit error (column 371) and a high BEC possibility of four bit errors (column 372). In these and other embodiments, all of the BEC bins can be equivalent in size. In other embodiments, the bin sizes can vary. For example, the bin sizes can increase and/or decrease linearly and/or non-linearly (e.g., exponentially).

In some embodiments, the routine 240 continues to collect BEC codeword information for the life of a memory device 100. In these embodiments, the routine 240 can scan a same codeword stored at a same memory location on a same memory region for the life of the memory device 100 multiple times over the life of the memory device 100, and/or the routine 240 can save BEC information for the same codeword to the histogram 370 each time the routine 240 scans the codeword. In these and other embodiments, the BEC histogram 370 can be reset. For example, the counter values in the rows 380 of the columns 375-378 of the histogram 370 can have a maximum value limit of 0xFFFFFFFF (e.g., because of constraints on the amount of memory the histogram 370 can occupy). In these embodiments, the routine 240 can reset one or more (e.g., every) counter values in the histogram 370 to a zero state when one or more counter value limits are reached (e.g., anywhere in the histogram 370). In some embodiments, the routine 240 can continue to save codeword BEC information to the histogram 370 from the all zero state in the current and/or the next iteration of the routine 240. In these and other embodiments, the routine 240 can divide all bin values in half when one or more counter value limits are reached and can continue counting from the half state in the current and/or the next iteration of the 240. In some embodiments, the routine 240 can update a count flag to indicate the number of times routine 240 has divided each value in half. In these and other embodiments, the routine 240 can increment the counter values by values other than one. For example, the routine 240 can increment all or a subset (e.g., the largest counter values and/or counter values approaching their maximum value limits) by a value less than one. This can, for example, (i) prevent and/or delay one or more counter values from reaching the maximum value limit; (ii) prevent and/or delay resetting and/or halving the counter values; and/or (iii) prevent and/or delay data related to the histogram 370 from exceeding the allotted memory space. In these and other embodiments, the routine 240 can increment the counter values by other values, including values greater than or equal to one. In these and still other embodiments, the routine 240 can reset the BEC histogram 370 when one or more other operations (e.g., a DPT update) are performed on the memory device 100.

In these and still other embodiments, the routine 240 can send and/or receive additional and/or alternative commands than shown in the embodiment illustrated in FIG. 2. For example, the routine 240 can be configured to send and/or receive a command (e.g., a VS command) to reset the BEC histogram 370. In some embodiments, the routine 240 can require a VS command before resetting the histogram 370. In these and other embodiments, the routine 240 can send and/or receive a command (e.g., a VS command) to check whether the routine 240 is ready to execute and/or is currently executing a background scan operation. In these and still other embodiments, the routine 240 can send and/or receive a command (e.g., a VS command) to output the BEC histogram 370. In some embodiments, the routine 240 can require a VS command before outputting the histogram 370 (e.g., to the host device 108).

As described in greater detail below, the routine 240 and/or another operation of the memory device 100 and/or of the host device 108 can use quality metrics saved in the BEC histogram 370 for (e.g., post) processing and/or analysis of the memory device 100 and/or of the system 101. In these and other embodiments, the quality metrics saved in the histogram 370 can be used as a development, integration, and/or debugging tool of the memory device 100 and/or of the system 101. In these and still other embodiments, the quality metrics saved in the BEC histogram 370 can be used in other operations of the memory device 100 and/or of the system 101. For example, the BEC information can be used as feedback for a DPS error avoidance ECC operation (e.g., to determine program step size, for example, based on a margin to failure derived from quality metrics saved in the histogram 370).

In some embodiments, the routine 240 can return to blocks 241 and/or 242 from blocks 248 and/or 249. For example, the routine 240 can return to blocks 241 and/or 242 in a manner similar to how the routine 240 returns to blocks 241 and/or 242 from block 246, as discussed above. In these and other embodiments, the routine 240 can return to blocks 241 and/or 242 and proceed through the same and/or a different iteration of the routine 240 (e.g., on the next codeword in the memory region, on a next memory region, etc.). In these and still other embodiments, the routine 240 can wait to receive a subsequent command to perform a background scan (e.g., in accordance with an established schedule and/or cadence), and/or the routine 240 can immediately and/or automatically proceed to perform the same or a different iteration of the routine 240. For example, the routine 240 can continue indefinitely (e.g., if the memory device 100 and/or the host device 108 are still offline and/or are still in an idle state).

Although the steps of the routine 240 are discussed and illustrated in a particular order, the method illustrated by the routine 240 in FIG. 2 is not so limited. In other embodiments, the method can be performed in a different order. In these and other embodiments, any of the steps of the routine 240 can be performed before, during, and/or after any of the other steps of the routine 240. Moreover, a person of ordinary skill in the relevant art will readily recognize that the illustrated method can be altered and still remain within these and other embodiments of the present technology. For example, one or more steps of the routine 240 illustrated in FIG. 2 (e.g., blocks 244, 245, and/or 246) can be omitted and/or repeated in some embodiments.

Figure 4A:
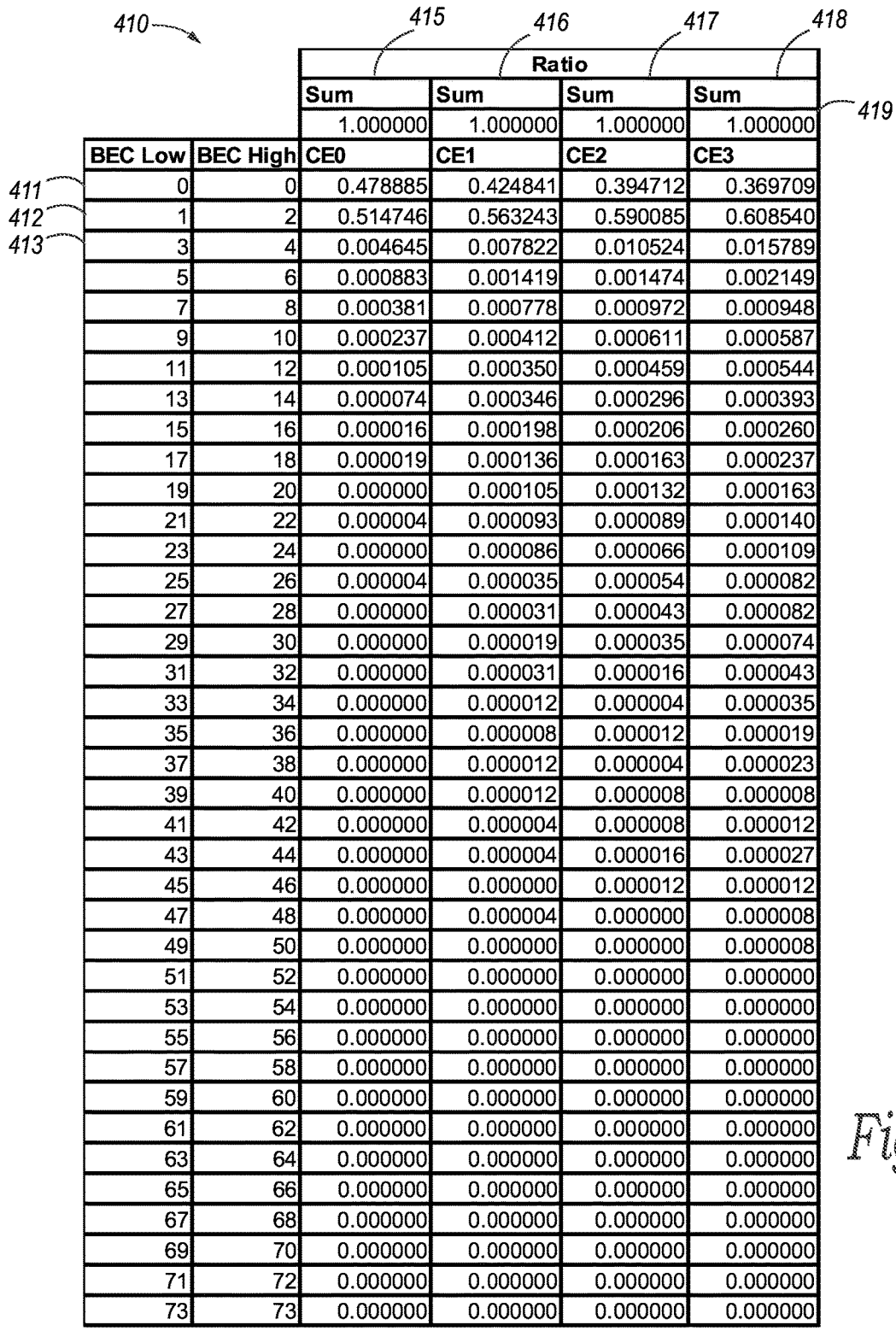

FIGS. 4A-4D are various tables of one or more BEC histogram statistics logs 410, 420, 430, and 440, respectively, and FIG. 4E is an aggregate BEC histogram 450 that can be created, generated, and/or maintained in addition to or in lieu of the BEC histogram 370 shown in FIG. 3. In some embodiments, the logs 410, 420, 430, and/or 440, and/or the histogram 450 can be a part of the BEC histogram 370 illustrated in FIG. 3. In these and other embodiments, the routine 240 can create, generate, and/or maintain one or more of the logs 410, 420, 430, and/or 440, and/or the histogram 450 at block 249 of the routine 240 illustrated in FIG. 2. In these and still other embodiments, one or more of the logs 410, 420, 430, and/or 440, and/or the histogram 450 can be created, generated, and/or maintained before, during, and/or after the routine 240 (e.g., as post processing by one or more other operations of the memory device 100 and/or of the host device 108).

Referring to FIG. 4A, a ratio BEC histogram statistics log 410 can be created, generated, and/or maintained to provide information regarding how many decoded, non-UECC codewords in each memory die 120 have a BEC corresponding to BEC bins defined by the rows 380 of the columns 371 and 372 in the BEC histogram 370. As shown, the ratio BEC histogram statistics log 410 can have columns 415, 416, 417, and 418 corresponding to the four memory die (i.e., CE0, CE1, CE2, and CE3) represented by the columns 375-378, respectively, in the BEC histogram 370 illustrated in FIG. 3. Each of the columns 415-418 in the log 410 have rows corresponding to the rows 380 of the BEC histogram 370. For example, rows 411, 412, and 413 of the log 410 can correspond to the rows 381, 382, and 383 of the histogram 370. In the embodiment illustrated in FIG. 4A, each row in the log 410 can save a value corresponding to the ratio of codewords in a memory die falling into a corresponding BEC bin defined by the rows 380 of the columns 371 and 372 in the histogram 370. For example, the 123,097 codewords in the memory die CE0 having zero bit errors (e.g., the BEC count value saved in the row 381 of the column 375 in the histogram 370) represent approximately 47.89% (i.e., the ratio value saved in the row 411 of the column 415 in the log 410) of all decoded, non-UECC codewords in the memory die CE0. In some embodiments, a value corresponding to a total number of decoded codewords in a memory die (e.g., the total number of decoded codewords in the memory die CE3) saved in the cell 379 in histogram 370 can be used to generate the ratio values saved in the log 410. For example, the ratio value saved in the row 411 of the column 415 in the log 410 (i.e., 0.478885) can be generated by dividing the BEC count value saved in the row 381 of the column 375 in the histogram 370 (i.e., 123,097) by the total number of decoded codewords in the memory die CE0 saved in column 375 of the histogram 370 (i.e., 257,049).

In some embodiments, the ratio BEC histogram statistics log 410 can save a value corresponding to the sum of each of the ratio values in each column (e.g., for error checking purposes and/or to generate a 1-CDF BEC histogram statistics log, as discussed in greater detail below with respect to FIG. 4C). For example, cell 419 of the log 410 can save a value corresponding to a sum of each ratio value listed in the column 418 of the log 410. In this embodiment, the value saved in the cell 419 corresponds to 100%, meaning that all decoded, non-UECC codewords in the memory die CE3 for which the routine 240 entered BEC information into the histogram 370 are represented in the column 378 of the histogram 370 and in the column 418 of the log 410.

Referring now to FIG. 4B, a CDF BEC histogram statistics log 420 can be created, generated, and/or maintained to provide information regarding how many decoded, non-UECC codewords in each memory die 120 have a BEC equivalent to or better than a BEC corresponding to the BEC bins defined by the rows 380 of the columns 371 and 372 in the BEC histogram 370 (FIG. 3). As shown, the CDF BEC histogram statistics log 420 can have columns 425, 426, 427, and 428 corresponding to the four memory die (i.e., CE0, CE1, CE2, and CE3) represented by the columns 375-378, respectively, in the BEC histogram 370 and/or by the columns 415-418, respectively, in the ratio BEC histogram statistics log 410 illustrated in FIG. 4A. Each of the columns 425-428 in the log 420 have rows corresponding to the rows 380 of the histogram 370 and/or to the rows of the log 410. For example, rows 421, 422, and 423 of the log 420 can correspond to the rows 381-383 of the histogram 370, respectively, and/or to the rows 411-413 of the log 410, respectively. In the embodiment illustrated in FIG. 4B, the log 420 is a cumulative distribution function log. As such, each row in each column of the log 420 can save a value corresponding to a summation of (i) ratio values saved in a corresponding row and column in the log 410 and (ii) ratio values saved in all rows in the corresponding column in the log 410 above the corresponding row (if any). For example, the CDF value saved in the row 423 of the column 425 in the log 420 (i.e., 0.998277) is a summation of (i) the ratio value (i.e., 0.004645) saved in the corresponding row and column in the log 410 (i.e., the row 413 of the column 415) and (ii) all ratio values (i.e., 0.514746 and 0.478885) saved in rows of the corresponding column above the corresponding row in the log 410 (i.e., the rows 412 and 411 of the column 415, respectively). The value saved in the log 420 is also equivalent to a summative of (i) the ratio value saved in a corresponding row and column in the log 410 and (ii) a CDF value saved in an immediate row above it within the same column of the log 420. For example, the CDF value saved in the row 423 of the column 425 in the log 420 (i.e., 0.998277) is a summation of (i) the ratio value (i.e., 0.004645) saved in the corresponding row and column in the log 410 (i.e., the row 413 of the column 415) and (ii) the CDF value (i.e., 0.993632) saved in the immediate row above it within the same column of the log 420 (i.e., the row 422 of the column 425). Thus, the CDF BEC histogram statistics log 420 explains that approximately 99.83% of decoded, non-UECC codewords in the memory die CE0 have a BEC of four bit errors or better (i.e., four bit errors or less).

Figure 4C:
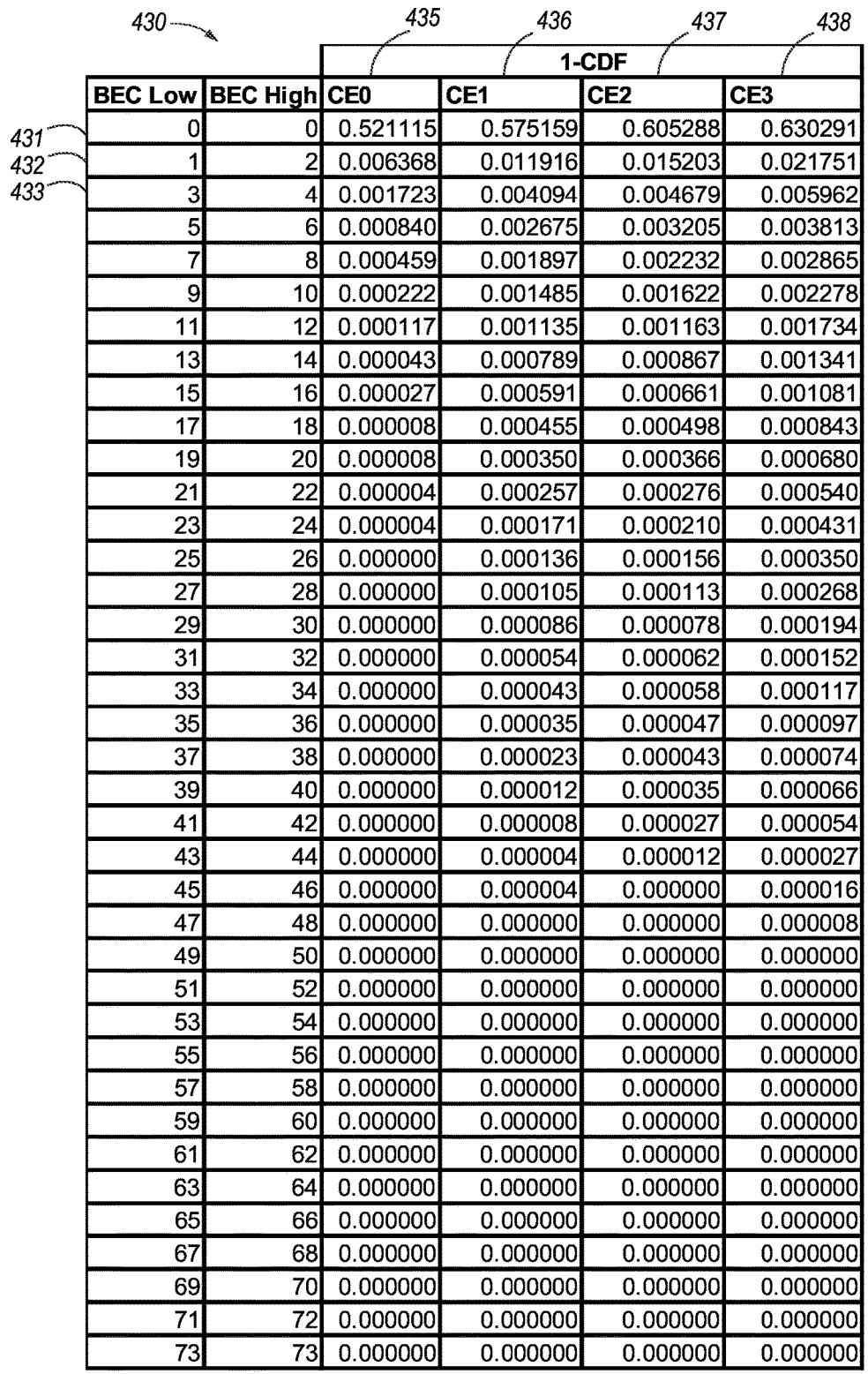

Referring now to FIG. 4C, a 1-CDF BEC histogram statistics log 430 can be created, generated, and/or maintained to provide information regarding how many decoded, non-UECC codewords in each memory die 120 have a BEC worse than a BEC corresponding to the BEC bins defined by the rows 380 of the columns 371 and 372 in the histogram 370 (FIG. 3). In other words, the 1-CDF BEC histogram statistics log 430 represents the "tails" of the information saved and/or provide by the CDF BEC histogram statistics log 420. As shown, the 1-CDF BEC histogram statistics log 430 can have columns 435, 436, 437, and 438 corresponding to the four memory die (i.e., CE0, CE1, CE2, and CE3) represented by the columns 375-378, respectively, in the BEC histogram 370; by the columns 415-418, respectively, in the ratio BEC histogram statistics log 410 (FIG. 4A); and/or by the columns 425-428, respectively, in the CDF histogram statistics log 420 (FIG. 4B). Each of the columns 435-438 in the log 430 have rows corresponding to the rows 380 of the histogram 370, to the rows of the log 410, and/or to the row of the log 420. For example, rows 431, 432, and 433 of the log 430 can correspond to the rows 381-383 of the histogram 370, respectively; to the rows 411-413 of the log 410, respectively; and/or to the rows 421-423 of the log 420, respectively.

In the illustrated embodiment, the log 430 is a 1-CDF BEC histogram statistics log 430. As such, 1-CDF values saved in the log 430 can be generated by subtracting CDF values saved in corresponding rows and columns in the CDF BEC histogram statistics log 420 from one (1.0). Additionally or alternatively, the 1-CDF values saved in the log 430 can be generated by subtracting the CDF values saved in the corresponding rows and columns in the log 420 from a value saved in the ratio BEC histogram statistics log 410 (e.g., in the cell 419) and representing a summation of each of the ratio values saved in a corresponding column in the log 410. This can account for errors in the BEC histogram 370 and/or for errors in the log 410. For example, a 1-CDF value of 0.521115 is saved in the row 431 of the column 435 in the log 430. This 1-CDF value can be generated by subtracting a CDF value saved in the corresponding row and column of the log 420 (i.e., the row 421 of the column 425) (i) from one (1.0) and/or (ii) from the sum of ratio values saved in the corresponding column (i.e., column 415) of the log 410. Thus, the 1-CDF BEC histogram statistics log 430 explains that approximately 52.11% of decoded, non-UECC codewords in the memory die CE0 have a BEC worse than zero bit errors (i.e., greater than zero bit errors).

Referring now to FIG. 4D, a Log 10(1-CDF) BEC histogram statistics log 440 can be created, generated, and/or maintained to facilitate linear analysis of the BEC information provided by a background scan operation (e.g., one or more iterations of the routine 240; FIG. 2), as described in greater detail below with respect to FIG. 5. As shown, the Log 10(1-CDF) BEC histogram statistics log 440 can have columns 445, 446, 447, and 448 corresponding to the four memory die (i.e., CE0, CE1, CE2, and CE3) represented by the columns 375-378, respectively, in the BEC histogram 370 (FIG. 3); by the columns 415-418, respectively, in the ratio BEC histogram statistics log 410 (FIG. 4A); by the columns 425-428, respectively, in the CDF histogram statistics log 420 (FIG. 4B); and/or by the columns 435-438, respectively, in the 1-CDF histogram statistics log 430 (FIG. 4C). Each of the columns 445-448 in the log 440 have rows corresponding to the rows 380 of the histogram 370, to the rows of the log 410, to the rows of the log 420, and/or to the rows of the log 430. For example, rows 441, 442, and 443 of the log 440 can correspond to the rows 381-383 of the histogram 370, respectively; to the rows 411-413 of the log 410, respectively; to the rows 421-423 of the log 420, respectively; and/or to the rows 431-433 of the log 430, respectively. In the illustrated embodiment, the log 440 is a Log 10(1-CDF) BEC histogram statistics log 440. As such, Log 10(1-CDF) values saved in the log 440 can be generated by taking the decadic logarithm of 1-CDF values saved in corresponding rows and columns in the 1-CDF BEC histogram statistics log 430. For example, a Log 10(1-CDF) value of −0.28307 can be saved in the row 441 of the column 445 in the log 440. This Log 10(1-CDF) value can be generated by taking the decadic logarithm of the 1-CDF value in the corresponding row and column of the log 430 (i.e., the row 431 of the column 435).

Referring now to FIG. 4E, an aggregate BEC histogram 450 can be created, generated, and/or maintained as an aggregate log of one or more memory regions (memory pages, memory blocks 128, memory die 120, etc.) in the memory device 100. In some embodiments, the histogram 450 can be created, generated, and/or maintained in addition to or in lieu of the BEC histogram 370. In the illustrated embodiment, the BEC histogram 450 is an aggregate log of BEC information regarding all four of the memory dies CE0-CE3 in the memory device 100 of the embodiment illustrated in FIG. 3. As shown in FIG. 4E, the histogram 450 can have columns 451-457. Each of the columns 451-457 in the histogram 450 have rows 460 corresponding to the rows 380 of the histogram 370 (FIG. 3), to the rows of the log 410 (FIG. 4A), to the rows of the log 420 (FIG. 4B), to the rows of the log 430 (FIG. 4C), and/or to the rows of the log 440 (FIG. 4D). For example, rows 461, 462, and 463 of the histogram 450 can correspond to the rows 381-383 of the histogram 370, respectively; to the rows 411-413 of the log 410, respectively; to the rows 421-423 of the log 420, respectively; to the rows 431-433 of the log 430, respectively; and/or to the rows 441-443 of the log 440, respectively.

In the illustrated embodiment, the histogram 450 is an aggregate BEC histogram 450 of the memory die CE0-CE3. As such, BEC counts saved in the rows 460 of the column 453 in the histogram 450 can be created, generated, and/or maintained by taking a summation of BEC counts saved in corresponding rows and columns of the histogram 370. For example, the aggregate BEC count value saved in the row 461 of the column 453 in the histogram 450 (i.e., 428,980) can be generated by summing the BEC count values saved in the row 381 of the columns 375, 376, 377, and 378 in the histogram 370 (i.e., 123,097; 109,276; 101,490; and 95,117, respectively). In other embodiments, the aggregate BEC count values saved in the row 461 of the column 453 in the histogram 450 can be created, generated, and/or maintained by the routine 240 by incrementing a counter value saved in the row 461 of the column 453 each time the routine 240 decodes a non-UECC codeword in the memory device 100 having zero bit errors (i.e., corresponding to the BEC bin defined by the row 461 of the columns 451 and 452 in the histogram 450). In some embodiments, the histogram 450 can save a value corresponding to a total number of decoded, non-UECC codewords per memory device 100. For example, the histogram 450 (e.g., the routine 240) can increase a counter value saved in cell 458 of the aggregate BEC histogram 450 each time a counter value in the rows 460 of the column 453 is increased. This value can be similar to the counter value saved in the cell 379 of the histogram 370 discussed above and/or can be used to generate values in the row 460 in the column 454 of the histogram 450.

Ratio values saved in the column 454 of the histogram 450 can be created, generated, and/or maintained by taking a ratio of BEC count values saved in corresponding rows of the column 453 to the total number of decoded, non-UECC codewords value saved in the cell 458. In some embodiments, the histogram 450 can save a value corresponding to a sum of the ratio values in the column 454 (e.g., in cell 459 of the histogram 450) similar to the value saved in the cell 419 of the log 410 (e.g., as discussed above and/or for similar reasons). In these and other embodiments, the value corresponding to the sum of the ratio values in the column 454 (e.g., the value saved to the cell 459) can be used to generate 1-CDF values saved in the rows 460 of the column 456 in the histogram 450. CDF values, 1-CDF values, and/or Log 10(1-CDF) values saved in the columns 455-457 of the histogram 450 can be created, generated, and/or maintained in accordance with the discussion of the logs 420, 430, and/or 440 above.

Figure 5:
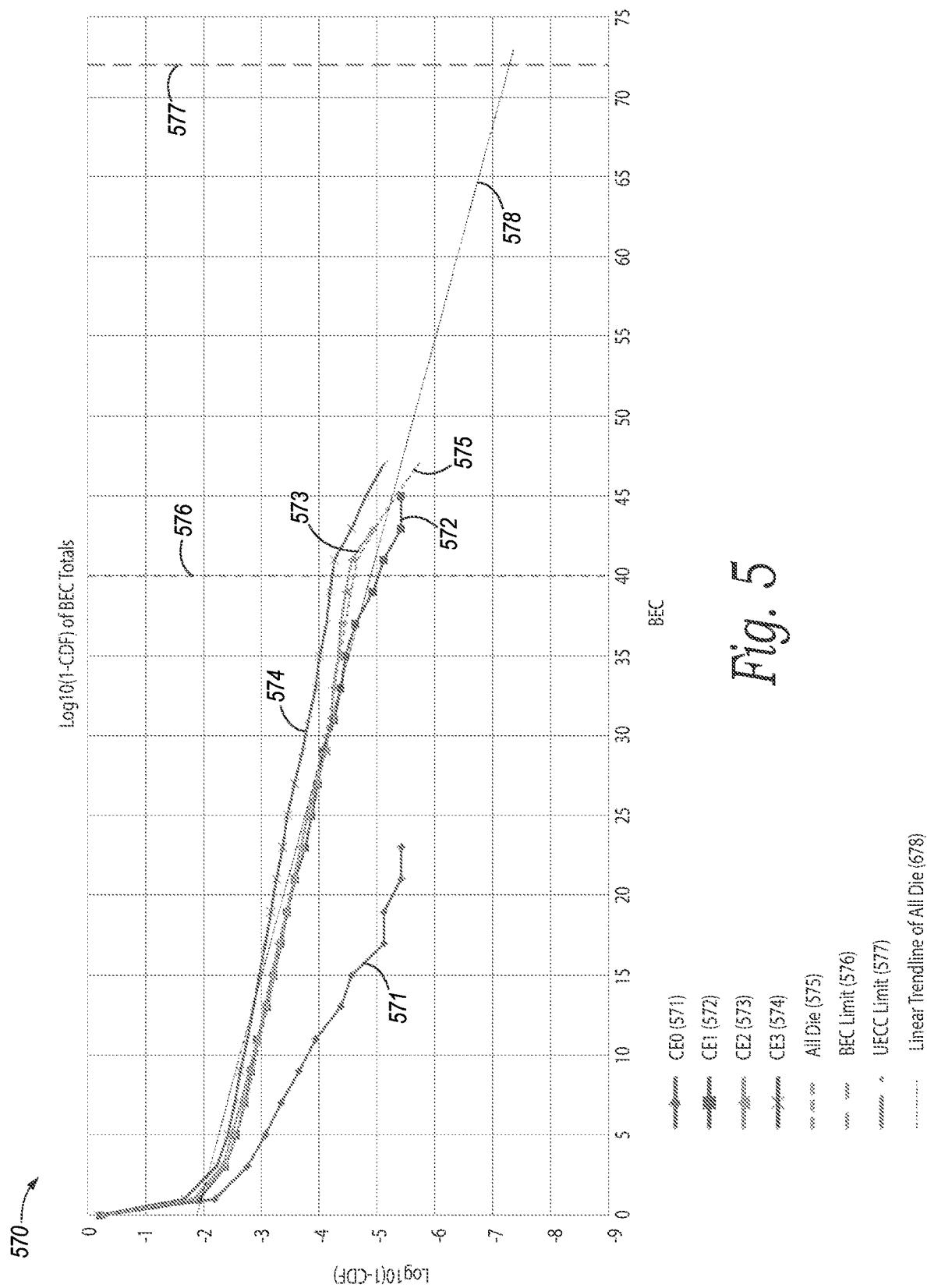
FIG. 5 is a plot illustrating decadic logarithm values saved in the bit error count histogram statistics logs illustrated in FIGS. 4D and 4E.

FIG. 5 is a plot 570 illustrating the decadic logarithm values saved in the columns 445-448 of the Log 10(1-CDF) BEC histogram statistics log 440 (FIG. 4D) and the decadic logarithm values saved in the column 457 of the aggregate BEC histogram 450 (FIG. 4E). In particular, the plot 570 shows the decadic logarithm values in the log 440 and the histogram 450 versus the low BEC possibility values of each BEC bin saved in the rows 380 of the column 371 in the BEC histogram 370 (FIG. 3) and/or saved in the rows 460 of the column 451 in the histogram 450. Plot series 571 illustrates the decadic logarithm values of the memory die CE0; plot series 572 illustrates the decadic logarithm values of the memory dies CE1; plot series 573 illustrates the decadic logarithm values of the memory dies CE2; and plot series 574 illustrates the decadic logarithm values of the memory dies CE3. In addition, plot series 575 illustrates the aggregate decadic logarithm values of all the memory dies CE0-CE3 and saved in the histogram 450. The plot 570 is provided to illustrate several advantages of the background scan operation and to illustrate possible post processing possibilities.

In the illustrated embodiment, vertical dashed line 576 represents a codeword BEC threshold. In this embodiment, the codeword BEC threshold for the memory device 100 is defined to be 40 bit errors. Thus, if a background scan operation (e.g., the routine 240) determines a decoded, non-UECC codeword has a BEC greater than (or equal to) 40 bit errors, the background scan operation (i) triggers a folding event and (ii) schedules and/or performs a refresh and/or retirement operation (e.g., a garbage collection operation) on all or a subset of the memory region on which the codeword is saved. In the illustrated embodiment, the plot series 572, 573, and 574 of the plot 570 show that background scan operation(s) performed on the memory die CE1, CE2, and CE3, respectively, (i) read and decoded non-UECC codewords having 40 and/or greater bit errors and (ii) refreshed and/or retired corresponding memory regions on the memory die CE1-CE3. This can be seen by a downturn in the plot series 572-575 shortly to the right of the vertical dashed line 576 illustrated in FIG. 5. As a result, an undesirable loss of user data was prevented before the corresponding memory regions on the memory die CE1-CE3 became a problem. Furthermore, the background scan operation (e.g., the routine 240) can save an indication of memory locations of the unreliable codewords to memory, as described above. As such, the indication can be output to further analyze the folding events and/or the corresponding memory regions (e.g., to perform failure analysis) and/or to make other block management decisions.

The plot 570 also illustrates that the plot series 571 has not yet reached the vertical dashed line 576. This means that the memory die CE0 is performing well and no memory regions on the memory die CE0 have triggered a folding event and/or have needed refreshing and/or retiring operations. A margin to failure value can be calculated from the plot series 571 to the vertical dashed line 576, which can be useful in other operations of the memory device 100, the host device 108, and/or the system 101 (e.g., in a DPS error avoidance ECC operation).

In the plot 570 illustrated in FIG. 5, vertical dashed line 577 represents a UECC limit. In other words, the vertical dashed line 577 represents the point at which a memory region failure occurs. In some embodiments, the UECC limit can be set to where the memory device 100 can still recover data stored on corresponding memory regions (e.g., the memory device 100 has one or more error recovery operations available at this point). In these and other embodiments, the UECC limit can be set at a point to where data stored on a corresponding memory region is corrupted and/or is not recoverable. In any embodiment, the UECC limit is defined as a trigger event (e.g., a deeper error recovery retry event and/or a RAID event if deeper error recovery also fails to correct the codeword) and leads to a loss in performance of the memory device. As such, a background scan operation configured in accordance with embodiments of the present technology attempt to prevent and/or to delay memory regions in the memory device 100 from reaching this point (e.g., by refreshing and/or retiring these memory regions at the codeword BEC threshold or the point illustrated by the vertical dashed line 576). In the plot 570 illustrated in FIG. 5, the vertical dashed line 577 (i.e., the UECC limit for the memory device 100) is defined to be 72 bit errors.

As shown by the folding events of the plot series 572-575, one or more background scan(s) performed on corresponding memory regions on the memory die CE1-CE3 delay and/or prevent memory regions on the memory die CE1-CE3 from reaching the vertical dashed line 577 and triggering a failure event (e.g., thereby extending the life of and/or increasing the performance of the memory device 100). Thus, the background scan operation(s) preserve margin between the plot series 572-575 and the vertical dashed line 577. In addition, because the background scan saves the BEC information, margin values for each memory die CE0-CE3 and/or for the memory device 100 as a whole can be calculated. For example, linear trend line curves (e.g., a linear trend line of the memory device 100 illustrated by plot series 578) can be fit to BEC information (e.g., the plot series 575) saved by the background scan operation(s) to calculate the margin values. Thus, the background scan operation(s) can facilitate margin to failure analysis and/or margin loss trend analysis of memory regions (e.g., the memory dies CE0-CE3, the memory device 100, etc.) at any point within the life of the memory device 100.

In these and other embodiments, the background scan operation(s) (e.g., the routine 240) can schedule and/or perform (e.g., immediate) refresh and/or retirement operations on any discovered and/or encountered UECC memory regions (e.g., thereby increasing the likelihood of recovering data and/or extending the life of the memory device 100). Additionally or alternatively, the background scan operation(s) can save an indication of a memory location of UECC codewords and/or corresponding memory regions to memory, as discussed above. As such, the indication can be used in post-processing to further analyze the UECC failure events and/or the corresponding memory regions (e.g., to perform failure analysis) and/or to make other block management decisions.

Figure 6:
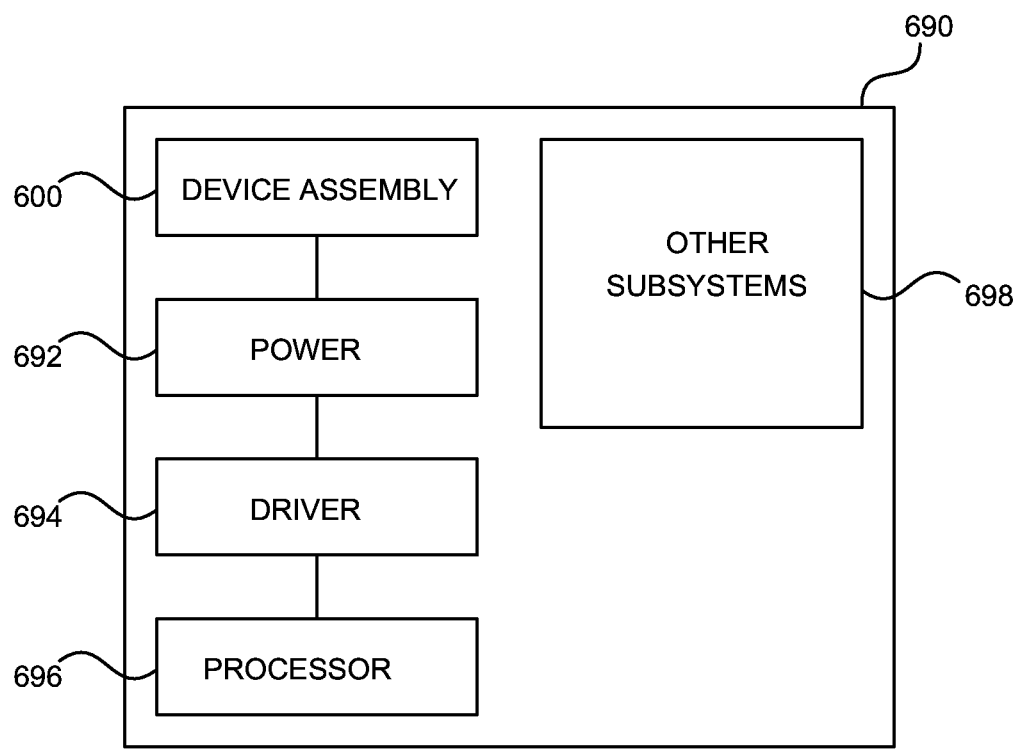
FIG. 6 is a schematic view of a system that includes a memory device in accordance with embodiments of the present technology.

FIG. 6 is a schematic view of a system that includes a memory device in accordance with embodiments of the present technology. Any one of the foregoing memory devices described above with reference to FIGS. 1-5 can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory device described above with reference to FIGS. 1-5, and can, therefore, include various features of memory content authentication. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, (i) a background scan operation can be performed on and/or (ii) any one of the logs discussed above can be saved on memory regions other than the memory component (e.g., the embedded memory of a controller) in addition to or in lieu of the memory component. Furthermore, all or a subset of a background scan operation can be performed during (e.g., as part of) another operation of a memory device, a host device, and/or a memory system. For example, BEC information regarding codewords can be saved (e.g., to a BEC histogram statistics log) during (e.g., as part of) an access operation of the memory system. In addition, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A system, comprising:
    a memory component comprising a plurality of memory regions configured to store a plurality of codewords; and
    a processing device operably connected to the memory component, wherein the processing device is configured to
        generate a bit error count (BEC) of a first codeword of the plurality of codewords saved to a first memory region in the plurality of memory regions; and
        store statistical information corresponding to the BEC of the first codeword in a BEC histogram corresponding to the plurality of codewords, wherein storing the statistical information comprises incrementing a counter value of a bin of the BEC histogram corresponding to the BEC of the first codeword.

2. The system of claim 1 further comprising an error correction code (ECC) engine, and wherein the BEC of the first codeword is less than or equal to a BEC capability of the ECC engine.

3. The system of claim 1, wherein the first memory region is a memory block, a memory die, a memory page, a stripe of memory pages, or a superblock.

4. The system of claim 3, wherein the first memory region is a stripe of memory pages, and wherein the processing device is configured to select the first memory region from within an oldest, fully-programmed superblock in the memory component.

5. The system of claim 1, wherein the processing device is further configured to
    determine if one or more bit errors are present in the first codeword; and
    perform a limited subset of error recovery error correction code (ECC) operations available to the processing device on the first codeword in an event bit error(s) are present in the first codeword.

6. The system of claim 1, wherein the processing device is configured to generate the BEC of the first codeword and to store the statistical information corresponding to the BEC of the first codeword in response to a determination that the system is idle.

7. The system of claim 1, wherein the processing device is configured to generate the BEC of the first codeword and to store the statistical information corresponding to the BEC of the first codeword in response to a determination that a predetermined delay has elapsed since a previous operation to store statistical information in the BEC histogram was completed.

8. The system of claim 1, wherein the processing device is configured to generate the BEC of the first codeword and to store the statistical information corresponding to the BEC of the first codeword in response to a corresponding command received from a coupled host device.

9. The system of claim 1, wherein to generate the BEC of the first codeword, the processing device is configured to decode the first codeword of the plurality of codewords saved to the first memory region in the plurality of memory regions.

10. The system of claim 1, wherein the processing device is further configured to reset the BEC histogram in response to receiving a vender specific command in response to determining that a counter value stored in the BEC histogram reaches a maximum value, and/or after detecting a dynamic program target (DPT) update.

11. A method, comprising:
generating a bit error count (BEC) of a first codeword in a plurality of codewords saved to a first memory region in a plurality of memory regions; and
storing statistical information corresponding to the BEC of the first codeword in a BEC histogram corresponding to the plurality of codewords, wherein storing the statistical information comprises incrementing a counter value of a bin of the BEC histogram corresponding to the BEC of the first codeword.

12. The method of claim 11 further comprising
determining if one or more bit errors are present in the codeword; and
performing a limited subset of available error recovery error correction code (ECC) operations on the first codeword in an event bit error(s) are present in the first codeword.

13. The method of claim 11 further comprising
generating a BEC of a second codeword in the plurality of codewords saved to the first memory region or a second memory region in the plurality of memory regions; and
storing statistical information corresponding to the BEC of the second codeword in the BEC histogram.

14. The method of claim 13, wherein generating the BEC of the second codeword includes generating the BEC of the second codeword a first time period after generating the BEC of the first codeword in accordance with a scheduled cadence.

15. A non-transitory computer-readable storage medium comprising instructions that, when executed by a processing device, cause the processing device to:
generate a bit error count (BEC) of a first codeword in a plurality of codewords saved to a first memory region in a plurality of memory regions; and
store statistical information corresponding to the BEC of the first codeword in a BEC histogram corresponding to the plurality of codewords, wherein storing the statistical information comprises incrementing a counter value of a bin of the BEC histogram corresponding to the BEC of the first codeword.

16. The non-transitory computer-readable storage medium of claim 15, wherein the processing device is further to:
determine if one or more bit errors are present in the codeword; and
perform a limited subset of available error recovery error correction code (ECC) operations on the first codeword in an event bit error(s) are present in the first codeword.

17. The non-transitory computer-readable storage medium of claim 15, wherein the processing device is further to:
generate a BEC of a second codeword in the plurality of codewords saved to the first memory region or a second memory region in the plurality of memory regions; and
store statistical information corresponding to the BEC of the second codeword in the BEC histogram.

* * * * *